(12) United States Patent
Miyoshi et al.

(10) Patent No.: US 11,984,697 B2
(45) Date of Patent: May 14, 2024

(54) OPTICAL MEMBER AND LIGHT EMITTING DEVICE

(71) Applicant: NICHIA CORPORATION, Anan (JP)

(72) Inventors: Tomonori Miyoshi, Tokushima (JP); Hiroaki Yuto, Awa (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/181,150

(22) Filed: Mar. 9, 2023

(65) Prior Publication Data

US 2023/0216268 A1 Jul. 6, 2023

Related U.S. Application Data

(63) Continuation of application No. 17/388,728, filed on Jul. 29, 2021, now Pat. No. 11,646,544, which is a continuation of application No. 16/230,690, filed on Dec. 21, 2018, now Pat. No. 11,108,210.

(30) Foreign Application Priority Data

Dec. 26, 2017 (JP) ................................ 2017-249795

(51) Int. Cl.
| | | |
|---|---|---|
| *H01S 5/00* | (2006.01) | |
| *H01S 5/02257* | (2021.01) | |
| *H01S 5/042* | (2006.01) | |
| *H01S 5/068* | (2006.01) | |
| *H01S 5/02216* | (2021.01) | |

(Continued)

(52) U.S. Cl.
CPC ........ *H01S 5/0087* (2021.01); *H01S 5/02257* (2021.01); *H01S 5/042* (2013.01); *H01S 5/06825* (2013.01); *H01S 5/0071* (2013.01); *H01S 5/02216* (2013.01); *H01S 5/02325* (2021.01); *H01S 5/02469* (2013.01)

(58) Field of Classification Search
CPC ............................... H01L 33/50; H01S 5/0087
See application file for complete search history.

(56) References Cited

U.S. PATENT DOCUMENTS

| | | | | |
|---|---|---|---|---|
| 5,708,530 A | * | 1/1998 | Huang ................. | G02B 27/142 |
| | | | | 359/634 |
| 2008/0237771 A1 | * | 10/2008 | Pilla ........................ | H04N 5/33 |
| | | | | 257/431 |
| 2013/0250544 A1 | | 9/2013 | Zink et al. | |

(Continued)

FOREIGN PATENT DOCUMENTS

| | | |
|---|---|---|
| CN | 104205373 A | 12/2014 |
| CN | 104460203 A | 3/2015 |

(Continued)

OTHER PUBLICATIONS

Final Office Action in U.S. Appl. No. 16/230,690 dated Mar. 25, 2021.

(Continued)

*Primary Examiner* — Michael Carter
(74) *Attorney, Agent, or Firm* — Foley & Lardner LLP

(57) ABSTRACT

An optical member includes: a conversion member including a fluorescent material; a light reflecting ceramic holding the conversion member, the conversion member and the light reflecting ceramic having a continuous surface; a light-transmissive film on the continuous surface; and a wiring on the light-transmissive film.

16 Claims, 22 Drawing Sheets

(51) Int. Cl.
*H01S 5/02325* (2021.01)
*H01S 5/024* (2006.01)

(56) References Cited

U.S. PATENT DOCUMENTS

| | | | |
|---|---|---|---|
| 2014/0009952 A1 | 1/2014 | Nomura et al. | |
| 2015/0085262 A1* | 3/2015 | Ogura | F21V 9/40 |
| | | | 362/326 |
| 2015/0316233 A1 | 11/2015 | Kawamata et al. | |
| 2016/0186936 A1 | 6/2016 | Kiyota | |
| 2016/0290856 A1 | 10/2016 | Fiederling et al. | |
| 2017/0102135 A1 | 4/2017 | Kawamata et al. | |
| 2017/0122505 A1 | 5/2017 | Kiyota et al. | |
| 2017/0317469 A1 | 11/2017 | Kiyota | |
| 2017/0345984 A1* | 11/2017 | Yamashita | H01L 33/507 |
| 2018/0006167 A1* | 1/2018 | Nomura | H01L 31/02322 |
| 2018/0119897 A1 | 5/2018 | Vogt et al. | |

FOREIGN PATENT DOCUMENTS

| | | |
|---|---|---|
| CN | 107438756 A | 12/2017 |
| JP | 2009-059641 A | 3/2009 |
| JP | 2010-024278 A | 2/2010 |
| JP | 2010-057180 A | 3/2010 |
| JP | 2013-166886 A | 8/2013 |
| JP | 2013-168586 A | 8/2013 |
| JP | 2013-168587 A | 8/2013 |
| JP | 2013-196920 A | 9/2013 |
| JP | 2014-190823 A | 10/2014 |
| JP | 2015-060159 A | 3/2015 |
| JP | 2016-092288 A | 5/2016 |
| JP | 2016-122692 A | 7/2016 |
| JP | 2016-122715 A | 7/2016 |
| JP | 2016-127142 A | 7/2016 |
| JP | 2016-177923 A | 10/2016 |
| JP | 2017-201688 A | 11/2017 |
| JP | 2017-216362 A | 12/2017 |
| WO | WO-2012/124522 A1 | 9/2012 |
| WO | WO-2014/021027 A1 | 2/2014 |
| WO | WO-2017/012763 A1 | 1/2017 |

OTHER PUBLICATIONS

Notice of Allowance in U.S. Appl. No. 16/230,690 dated Jun. 3, 2021.
Notice of Allowance in U.S. Appl. No. 17/388,728 dated Jan. 6, 2023.
Requirement for Restriction/Election in U.S. Appl. No. 16/230,690 dated Aug. 4, 2020.
U.S. Office Action in U.S. Appl. No. 16/230,690 dated Nov. 30, 2020.

* cited by examiner

OPTICAL MEMBER AND LIGHT EMITTING DEVICE

CROSS-REFERENCE TO RELATED APPLICATION

This is a continuation application of U.S. patent application Ser. No. 17/388,728, filed on Jul. 29, 2021, which is a continuation application of U.S. patent application Ser. No. 16/230,690, filed on Dec. 21, 2018 (now U.S. Pat. No. 11,108,210), which claims priority to Japanese Patent Application No. 2017-249795, filed on Dec. 26, 2017. The disclosures of these applications are incorporated herein by reference in their entireties.

BACKGROUND

The present disclosure relates to an optical member, a light emitting device, and a method of manufacturing an optical member.

A light emitting device using a laser element is known in the art. In one example of a light emitting device using a laser element, an electrically conductive thin wire or an electrically conductive track is formed on a surface of a fluorescent material plate upon which laser light hits, to detect cracks or the like in the fluorescent material plate, so that leakage of laser light can be prevented (see, for example, JP 2015-60159 A and WO 2017/012763).

SUMMARY

However, in such a light emitting device, cracks or the like of the fluorescent material plate can be detected, but it is difficult to detect cracks or the like in the vicinity of a boundary portion between the fluorescent material plate and a holding member thereof. Displacement of the fluorescent material plate during use of the light emitting device is not detected as a defect unless the displacement causes breakage of a wire or the like for electrically connecting the electrically conductive thin wire or electrically conductive track to an external circuit. In view of this, prevention of leakage of laser light in such a light emitting device may be insufficient.

One object of the present disclosure is made to provide an optical member that can more accurately detect a defect that may cause leakage of laser light, a light emitting device using an optical member.

An optical member according to one embodiment of the present disclosure includes: a conversion member including a fluorescent material; a light reflecting ceramic holding the conversion member, the conversion member and the light reflecting ceramic having a continuous surface; a light-transmissive film on the continuous surface; and a wiring on the light-transmissive film.

A light emitting device according to another embodiment of the present disclosure includes: a conversion member including a fluorescent material; a light reflecting ceramic holding the conversion member, the conversion member and the light reflecting ceramic having a continuous surface; a light-transmissive film on the continuous surface; a wiring on the light-transmissive film; and a laser element disposed so as to irradiate the conversion member with a laser light.

With the optical member and the light emitting device according to certain embodiments of the present disclosure, it is possible to more accurately detect a defect that may cause leakage of laser light.

SUMMARY

DETAILED DESCRIPTION

Figure 1:
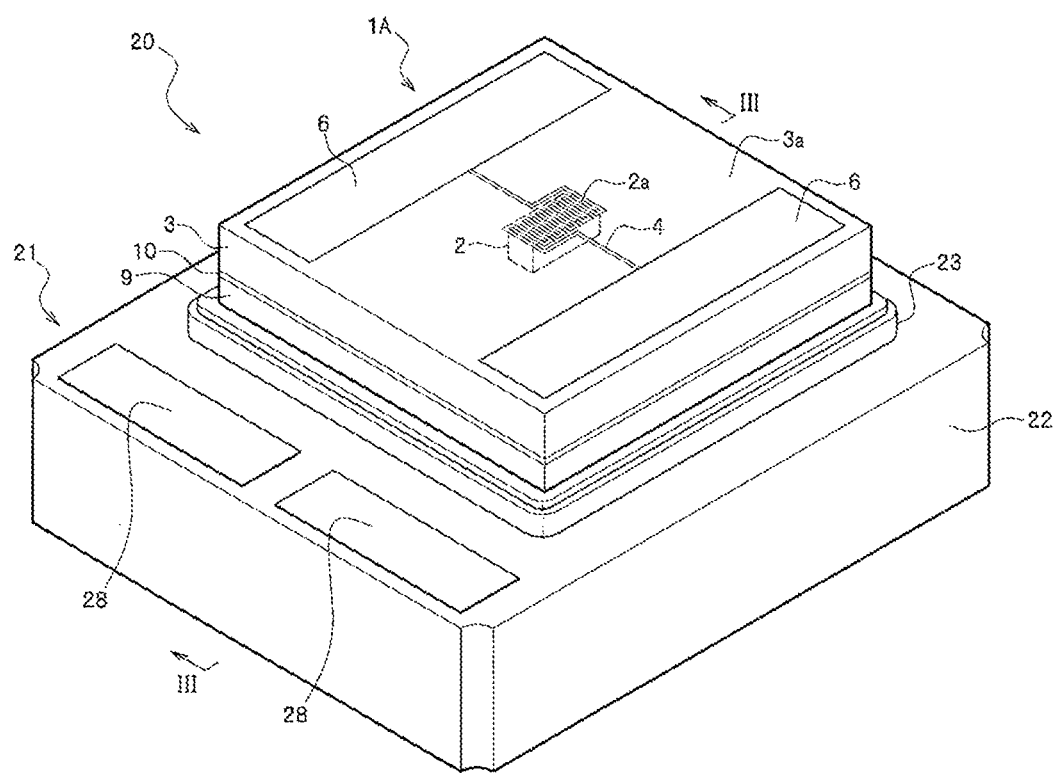
FIG. 1 is a schematic perspective diagram showing a configuration of a light emitting device using an optical member according to a first embodiment.

Certain embodiments of the present disclosure will be described below with reference to the drawings. However, the embodiments shown below are only examples of an optical member and a light emitting device to give a concrete form to the technical idea of the present invention, and the present disclosure is not limited to the embodiments shown below. Unless otherwise specified, the dimensions, materials, shapes, relative positions, and the like of the constituent components described in the embodiments below are not intended to limit the scope of the present invention thereto, and are merely illustrative. The sizes, positional relationships, and the like of the members shown in the drawings may be exaggerated for clarification of explanation. In the description below, the same names and reference numerals denote the same or similar members, and detailed descriptions thereof are omitted when appropriate.

First Embodiment

An optical member, a light emitting device, and a method of manufacturing an optical member according to a first embodiment will be described.

As shown in FIGS. 1 to 4, an optical member 1A includes a conversion member 2, a holding member 3 and a wiring 4. It is preferable that the optical member 1A further includes a heat dissipating member 9.

A light emitting device 20 includes the optical member 1A and a laser element 25. It is preferable that the light emitting device 20 further includes a package 21. It is more preferable that the light emitting device 20 further includes a detection circuit 30.

The constituent elements of the optical member 1A and the light emitting device 20 will be described below.

Optical Member
Conversion Member

A conversion member 2 has a first surface as a light extraction surface 2a, and is adapted to convert laser light, which is emitted by the laser element 25 and is an excitation light, into light having a different wavelength. In the converting member 2, a surface opposite to the light extraction surface 2a (i.e., first surface) is a light-irradiated surface 2b on which laser light from the laser element 25 is incident. With the wiring 4 disposed on the light extraction surface 2a (i.e., first surface), which is located at a surface side of the conversion member 2, connection to an external power supply or circuit for supplying the wiring 4 with electricity can be facilitated.

The conversion member 2 is preferably made of an inorganic material so that the conversion member 2 is not decomposed when irradiated with laser light. Examples of the inorganic material that forms the conversion member 2 include ceramic or glass containing a fluorescent material adapted to perform wavelength conversion of laser light, and fluorescent material single crystals. The conversion member 2 is preferably a material having a high melting point, with the melting point being preferably in a range of 1300° C. to 2500° C. With the conversion member 2 made of a material having high light resistance and heat resistance, the conversion member 2 is hardly degraded even by irradiation with light of high density such as laser light, and is hardly deformed, discolored and the like even under heat when held by the holding member 3. Thus, it is preferable that the conversion member 2 is formed of a material having high light resistance and heat resistance.

When a fluorescent material is used for the conversion member 2, examples of the conversion member 2 include yttrium aluminum garnet (YAG) activated with cerium, lutetium aluminum garnet (LAG) activated with cerium, nitrogen-containing aluminosilicate calcium (CaO—$Al_2O_3$—$SiO_2$) activated with europium and/or chromium, silicate ($(Sr, Ba)_2SiO_4$) activated with europium, an α-sialon fluorescent material, a β-sialon fluorescent material or the like. For the fluorescent material, YAG that is a fluorescent material having favorable heat resistance is preferably used.

When a ceramic is used for the conversion member 2, examples of the conversion member 2 include a material obtained by sintering a fluorescent material and a light-transmissive material such as aluminum oxide ($Al_2O_3$, melting point: approximately 1900° C. to 2100° C.). In the case of using a ceramic for the conversion member 2, the content of the fluorescent material is preferably in a range of 0.05 to 50% by volume, more preferably in a range of 1 to 30% by volume based on the total volume of the ceramic. A ceramic formed by sintering a fluorescent material powder without using such a light-transmissive material, and substantially made of only a fluorescent material may be used as the conversion member 2.

Holding Member

A holding member 3 holds the conversion member 2 and has a surface 3a (i.e., second surface) continuous with the light extraction surface 2a (i.e., first surface) of the conversion member in the same plane. The holding member 3 has a through-hole 3b extending through the holding member 3 in a thickness direction thereof, and is connected to the conversion member 2 with the conversion member 2 inserted in the through-hole 3b, which allows for holding the conversion member 2. The shape of the through-hole 3b is preferably matched with the shape of the conversion member 2, and may be, for example, a columnar shape, a conical shape, a circular conical shape, a pyramidal shape or a combination thereof.

The through-hole 3b may have a polygonal shape such as a triangular shape or a quadrangular shape, a circular shape or an elliptical shape in a plan view.

The thickness of the holding member 3 is preferably 0.2 mm or more in view of strength. The holding member 3 may have a thickness allowing the conversion member 2 to be held, and preferably has a thickness of 2.0 mm or less for suppressing an increase in cost and an increase in height of the optical member 1A.

The holding member 3 is preferably made of a material having a high reflectance with respect to laser light and fluorescence emitted by a fluorescent material and having a thermal conductivity high enough to exhaust heat of the conversion member 2 held in the through-hole 3b. Examples of the material having a high reflectivity and a high thermal conductivity include light reflective ceramics, metals and composites of a ceramic and a metal. A light reflective ceramic which easily exhibits a high reflectance is preferable. It is preferable to use an alumina ($Al_2O_3$) ceramic as the light reflecting ceramic. Using a material having a high reflectance with respect to the holding member 3 allows for extracting light in the conversion member 2 mainly from the light extraction surface 2a, so that the luminance can be increased. In addition, laser light irradiated to a component other than the conversion member 2 can be prevented from leaking outside.

Wiring

A wiring 4 is an elongated body extending continuously along the light extraction surface 2a (first surface) of the conversion member 2 and the surface 3a (second surface) of the holding member 3. The wiring 4 is not necessarily formed directly on a surface of the conversion member 2 and a surface of the holding member 3, and may be formed via a film such as a light-transmissive film 7 (see FIG. 14) disposed therebetween. The wiring 4 has a shape that can be drawn by a single stroke in a plan view. The wiring 4 is electrically connected to an electricity-supplying portion 6 for supplying electricity at both end portions of the wirings.

Figure 2:
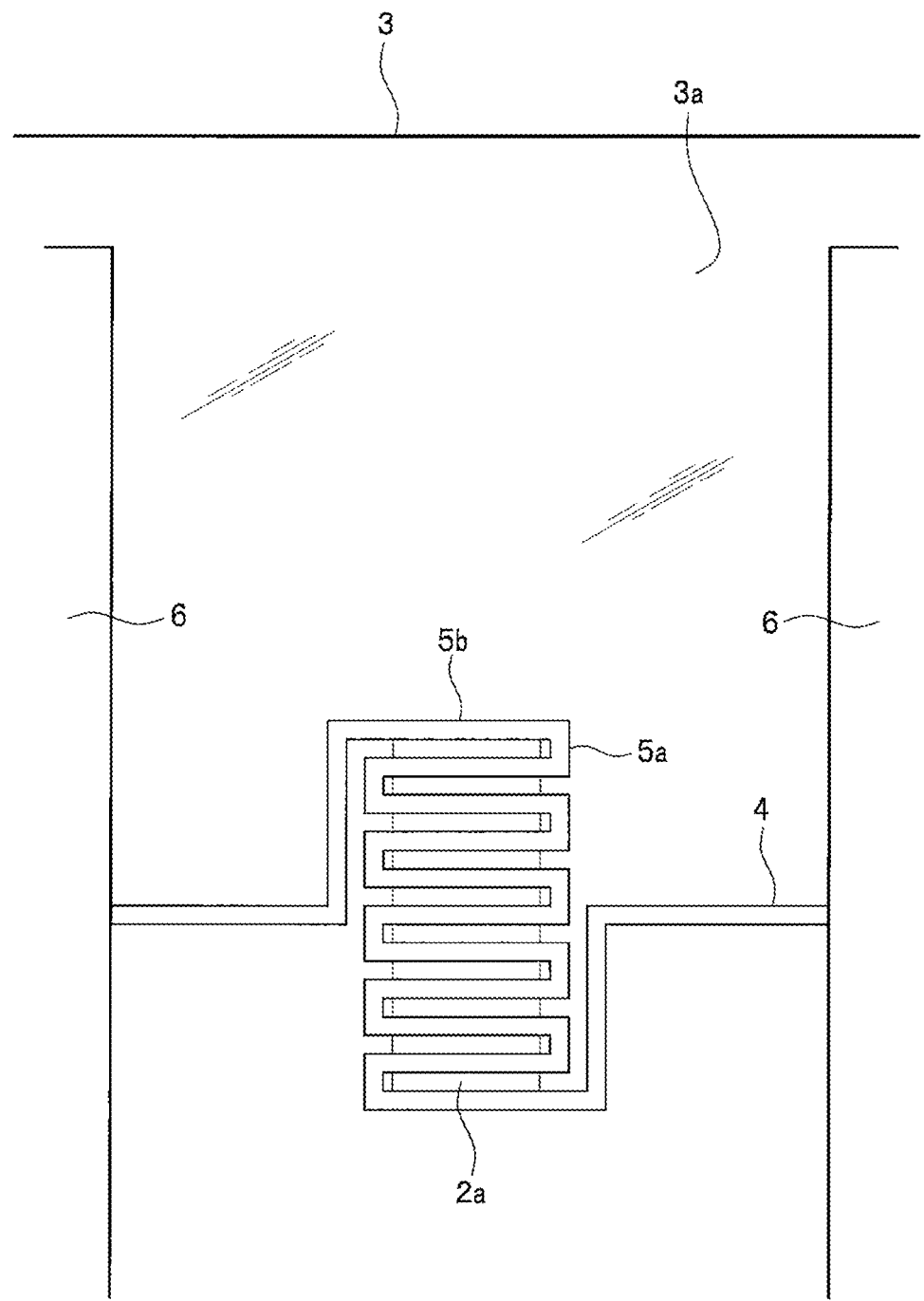
FIG. 2 is a schematic plan view showing a part of a holding member on the light extraction surface side in FIG. 1.
Figure 3:
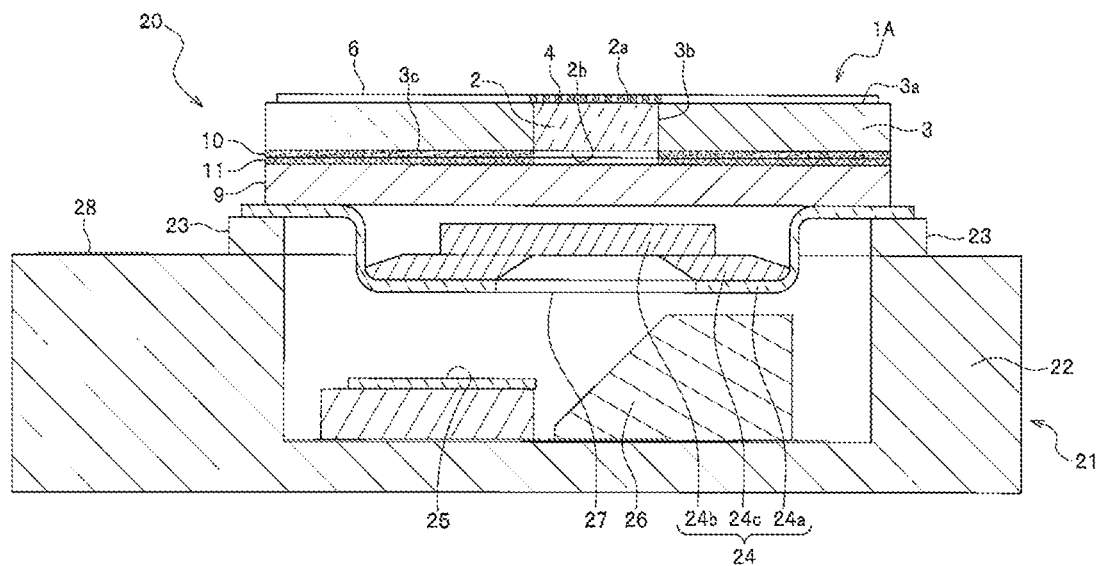
FIG. 3 is a schematic cross-sectional view taken along line III-III in FIG. 1.

As shown in FIGS. 1 to 3, the wiring 4 is disposed over boundary between the conversion member 2 and the holding member 3 to extend continuously along the light extraction surface 2a (i.e., first surface) of the conversion member 2 and the surface 3a (i.e., second surface) of the holding member 3, and. Accordingly, not only breakage or the like of the conversion member 2, but also breakage of a member in the vicinity of a boundary portion where strength tends to be lower as compared to other portions, e.g., cracks and misalignment can be detected from damage of the wiring 4. As used herein, "breakage of the wiring 4" is not limited to disconnection of the wiring 4, but includes partial or overall reduction in width and/or thickness due to chipping etc. That is, in the wiring 4, reduction in width or the like causes deviation in the resistance value, and thus the voltage value is deviated, which shows that the wiring 4 is in a state different from a normal state, so that breakage of a member can be detected. In this embodiment, breakage of the conversion member 2 and the holding member 3 in the vicinity of the boundary portion can be detected, and therefore a defect that may cause leakage of laser light can be more accurately detected. In this embodiment, breakage of the conversion member 2 and the holding member 3 in the vicinity of the boundary portion can be detected, and therefore a boundary between the conversion member 2 and the holding member 3 can be located at a position where laser light likely hits, so that the conversion member 2 can be downsized to increase brightness.

It is preferable that the wiring 4 covers at least a portion of the light extraction surface 2a (i.e., first surface) of the conversion member 2, a portion of the wiring 4 has a shape having a plurality of bent portions 5a in a plan view, and at least one of a plurality of bent portions 5a is disposed over the surface 3a (i.e., second surface) of the holding member 3. The number and the pitch of the bent portions 5a with a zigzag shape as shown in FIG. 2 are appropriately selected in consideration of the size of the through-hole 3b of the holding member 3 and the width of the wiring 4. With the wiring 4 having a zigzag shape, the wiring 4 extends over the boundary between the conversion member 2 and the holding member 3 at a plurality of positions, leading to improvement of accuracy of detecting breakage of the conversion member 2 and the holding member 3 in the vicinity of the boundary portion. In other words, the wiring 4 shown in FIGS. 1 to 3 has a shape including extending portions 5b that extend in a single direction and including bent portions 5a connecting adjacent ones of the extending portions 5b.

The wiring 4 is made of an electrically conductive material that is generally for as a wiring for the light emitting device 20. It is preferable that the wiring 4 is made of a light-transmissive electrically conductive material for preventing a decrease in brightness of light extracted from the conversion member 2. For the light-transmissive electrically conductive material, indium tin oxide (ITO), which has a high transmittance to visible light, is preferable. The electricity supplying portion 6 that is electrically connected to the wiring 4 at both ends of the wirings can also be made of an electrically conductive material and can have a film shape. When ITO is used for the wiring 4, it is preferable to provide a metal layer such as Ti/Pt/Au layer on the ITO layer so that the metal layer forms the outermost surface of the electricity supplying portion 6 for improving adhesion of a wire or the like.

For reducing unevenness in brightness of light extracted from the conversion member 2, the thickness of the wiring 4 is preferably in a range of 50 to 200 nm, at least above the conversion member 2. The width of the wiring 4 is preferably in a range of 5 to 50 μm. With a thickness of the wiring 4 less than 50 nm, or a width of the wiring 4 less than 5 μm, breakage of the wiring 4 such as disconnection tends to occur even though the conversion member 2 and the holding member 3 are not broken, and thus erroneous detection of damage of a member easily occurs. With a thickness of the wiring 4 more than 200 nm, or a width of the wiring 4 more than 50 μm, it is difficult to reduce unevenness in brightness of light extracted from the conversion member 2.

Heat Dissipating Member

A heat dissipating member 9 is a light-transmissive member disposed on the back surface 3c side of the holding member 3, and transmits laser light from the laser element 25. Sapphire, which is a material having light-transmissivity and a high thermal conductivity, is preferably used as a main member that forms the heat dissipating member 9. With the heat dissipating member 9, heat from the conversion member 2 can be efficiently dissipated. The thickness of the heat dissipating member 9 is, for example, in a range of 0.2 to 1 mm, preferably 0.4 to 0.6 mm.

First Metal Layer and Second Metal Layer

For bonding the heat dissipating member 9 and the holding member 3 to each other, a first metal layer 10 and a second metal layer 11 can be used. Each of the first metal layer 10 and the second metal layer 11 is preferably made of a metal material containing at least one selected from gold, tin, silver, nickel, rhodium, aluminum, tungsten, platinum, titanium, ruthenium, molybdenum and niobium. Each of the first metal layer 10 and the second metal layer 11 is, for example, a layered film including a titanium film, a platinum film and a gold film, or a layered film including a titanium film, a platinum film, a gold film, and a mixed film made of a gold/tin alloy. The first metal layer 10 is formed at the holding member 3 side, and the second metal layer 11 is formed at the heat dissipating member 9 side. For example, by forming a gold/tin alloy on one of the first metal layer 10 and the second metal layer 11, bringing the first metal layer 10 and the second metal layer 11 into contact with each other, and then applying heat to a temperature equal to or higher than the melting point of the gold/tin alloy, the heat dissipating member 9 and the holding member 3 can be bonded to each other. A thickness of each of the first metal layer 10 and the second metal layer 11 may be in a range of, for example, 0.1 to 5 μm. In a more specific example, the first metal layer 10 includes Ti (6 nm), Pt (200 nm) and Au (300 nm) sequentially from the holding member 3 side, and the second metal layer 11 includes Ti (6 nm), Pt (200 nm), Au (50 nm) and AuSn (3 μm) sequentially from the heat dissipating member 9 side. In addition, it is preferable that bonding members such as the first metal layer 10 and the second metal layer 11 are not formed at a position facing the conversion member 2. This allows for preventing laser light from being blocked by a bonding member such as the first metal layer 10. In this embodiment, the first metal layer 10 surrounds the light-irradiated surface 2b of the conversion member 2 that faces the heat dissipating member 9. Thus, the first metal layer 10 and the heat dissipating member 9 can effectively prevent deposition of dust on the light-irradiated surface 2b of the conversion member 2. Examples of the method for bonding the heat dissipating member 9 and the holding member 3 to each other include, as well as bonding via the first metal layer 10, normal-temperature bonding such as surface activation bonding or atomic diffusion bonding, and bonding using a resin. An organic material such as a resin may be decomposed by laser light, and thus it is preferable to use an inorganic material such as a metal.

Light Emitting Device
Laser Element

As shown in FIG. 3, a laser element 25 is disposed so that the conversion member 2 is irradiated with laser light. The shorter the wavelength of laser light emitted by the laser element 25, the higher the energy of the laser element 25, and detection of leakage of laser light is increasingly required.

Therefore, it is preferable that an element which emits laser light having a short wavelength is used for the laser element 25. Examples of the laser element include a nitride semiconductor laser element. The laser element 25 may also include a structure for irradiating the conversion member 2 with laser light, e.g., a reflection member 26, which is disposed in an optical path of the laser element 25.

For the reflection member 26, a member in which a reflection film is disposed on an inclined surface of a main body portion having a shape of triangular prism, quadrangular pyramid or the like and being made of glass or the like can be used. The angle of the inclined surface with respect to the bottom surface of the main body portion is preferably approximately 45° for guiding laser light in an orthogonal direction.

Package

A package 21 surrounds the laser element 25. The package 21 is a housing having a housing portion such as a recess 27, where the laser element 25 and the reflection member 26 are disposed and housed. The package 21 mainly includes a housing main body portion 22 made of a ceramic such as aluminum oxide, aluminum nitride, silicon nitride or silicon carbide, or a metal such as Cu, and a cover 24 bonded to the housing main body portion 22 by welding or the like. The housing main body portion 22 can define the recess 27 having an opening in the upper surface of the housing main portion. A frame-shaped welding portion 23, which is to be welded to the cover 24 and contains iron as a main component, may be disposed at the periphery of the opening of the recess. The housing main body portion 22 has an upper surface including a region that are adjacent to the opening of the recess 27 and surround the opening of the recess 37. At least one of the regions of the upper surface adjacent to and surround the opening of the recess 27 has a width larger than a width of the other(s) thereof, and an electrode portion 28 is disposed on the at least one region of the upper surface with the larger width. In the electrode portion 28, an anode and a cathode may be arranged at both sides of the optical member 1A in a plan view. When the housing main body portion 22 is made of a metal, for example, a lead terminal is used for the electrode portion 28.

The cover 24 is bonded to the housing main body portion 22 by welding or the like to hermetically seal the laser element 25. This allows for preventing deposition of dust such as an organic substance on the laser element 25. The cover 24 may include a support portion 24a welded to the housing main body portion 22; a light transmission portion 24b which transmits laser light; and a bonding material 24c for bonding the support portion 24a and the light transmission portion 24b. For the support portion 24a, a material containing iron as a main component can be used. For the light transmission portion 24b, glass, sapphire or the like can be used. For the bonding material 24c, low-melting-point glass, gold/tin solder, or the like can be used. Laser light emitted from the laser element 25 is reflected at the reflection member 26, transmitted through the light transmission portion 24b and the heat dissipating member 9, and irradiated to the light-irradiated surface 2b of the conversion member 2.

The package 21 includes the electrode portions 28 exposed at the upper surface of the housing main body portion 22. In the package 21, the electrodes portion 28 electrically connected to the outside is provided on a surface other than the lower surface of the housing main body portion 22, and thus an entirety of the lower surface of the package 21 can serve as a surface to be mounted on another member such as a heat sink. Therefore, the package 21 can easily release heat generated in the light emitting device 20 to the heat sink.

Detection Circuit

The detection circuit 30 is a circuit that detects a deviation in resistance value due to breakage of the wiring 4. In the light emitting device 20, the detection circuit 30 is a circuit connected to the wiring 4 and an electricity supplying circuit of the laser element 25. With the detection circuit 30, breakage of the conversion member 2 and the holding member 3 can be detected by detecting a deviation in resistance value due to breakage of the wiring 4. When a deviation in resistance value of the wiring 4 is detected, occurrence of breakage in the conversion member 2 and the holding member 3 is determined, and driving of the laser element 25 is stopped, so that leakage of laser light can be prevented.

The detection circuit 30 is configured to detect breakage of the wiring 4. The detection circuit 30 preferably has a circuit configuration as shown in FIG. 4.

Figure 4:
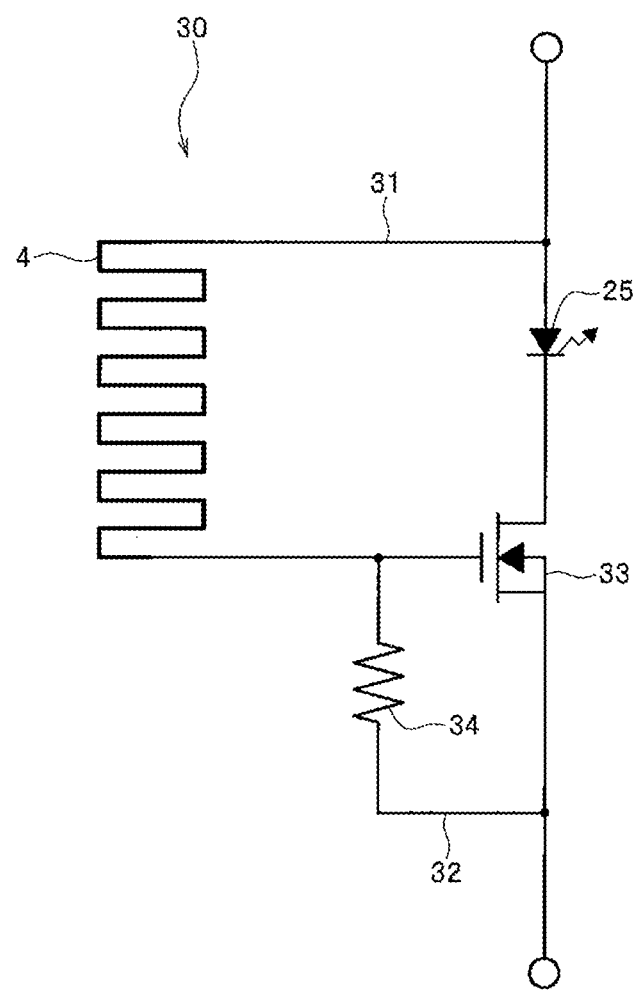
FIG. 4 is a schematic diagram showing a configuration of a detection circuit which detects a deviation in resistance value of a wiring.

In the detection circuit 30, a deviation in resistance value due to breakage of the wiring 4 is detected by detecting deviation in voltage value as shown in FIG. 4. The detection circuit 30 includes a first connecting conductor 31 and a second connecting conductor 32. A power source for supplying electricity, the wiring 4, the laser element 25 and a switch element 33 are connected to the first connecting conductor 31. A voltage detecting resistor 34 is connected to the second connecting conductor 32. Electricity is supplied to the wiring 4 and the voltage detecting resistor 34 by the power source for supplying electricity. The switch element 33 controls the stopping of driving of the laser element 25 based on, for example, comparison of the voltage across the voltage detecting resistor 34 with a reference voltage.

In the detection circuit 30, when electricity is supplied without causing breakage in the wiring 4, the resistance value of the wiring 4 is normally low, and the voltage across the wiring 4 is low, so that the voltage of the voltage detecting resistor 34 is relatively high, and thus is equal to or higher than the reference voltage. Meanwhile, driving of the laser element 25 is continued in response to an input from the switch element 33. If resistance of the wiring 4 is increased due to breakage of the wiring 4, the voltage of the wiring 4 increases, so that the voltage of the voltage detecting resistor 34 is relatively low. At this time, driving of the laser element 25 is stopped in response to an input from the switch element 33.

For the switch element 33, an operational amplifier, a comparator, a bipolar transistor, a metal-oxide-semiconductor field-effect transistor (MOSFET) or the like can be used. In particular, a transistor element such as a MOSFET, which can be turned ON and OFF in accordance with the voltage of the voltage detecting resistor 34, is preferable. For the switch element 33, for example, a transistor element such as a MOSFET, which is turned ON when the voltage of the voltage detecting resistor 34 is equal to or higher than the reference voltage, can be used. Accordingly, when the voltage of the voltage detecting resistor 34 decreases to a voltage lower than the reference voltage, the switch element 33 is turned OFF, so that supply of a current to the laser element 25 can be automatically stopped.

In the light emitting element 20, the optical member 1A is fixed to the package 21 so that laser light passing through the light transmission portion 24b and the heat dissipating member 9 from the recess 27 reaches the conversion member 2. It is preferable that a plurality of bent portions 5a of the wiring 4 is arranged so as to extend over boundary portions between the conversion member 2 and the holding member 3. This arrangement allows for accurately detecting damage of boundary portions between the conversion member 2 and the holding member 3 using the wiring 4. For fixing the optical member 1A to the package 21, the heat dissipating member 9, first metal layer 10 and the like can be used.

Method of Manufacturing Optical Member

A method of manufacturing the optical member 1A will be described.

Figure 5A:
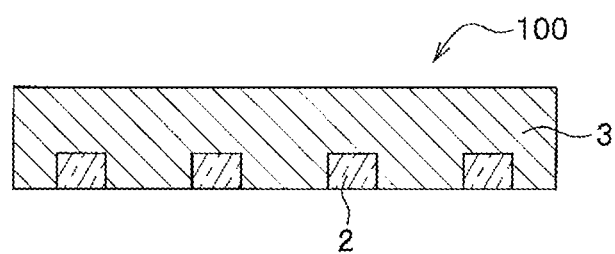
FIG. 5A is a schematic diagram for illustrating a method of manufacturing an optical member according to the first embodiment.
Figure 5B:
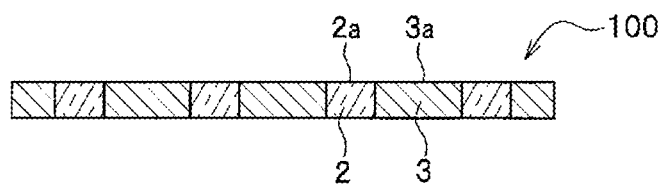
FIG. 5B is a schematic diagram for illustrating the method of manufacturing an optical member according to the first embodiment.
Figure 5C:
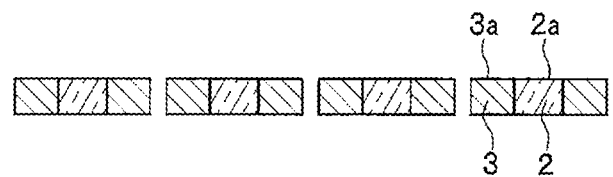
FIG. 5C is a schematic diagram for illustrating the method of manufacturing an optical member according to the first embodiment.
Figure 6:
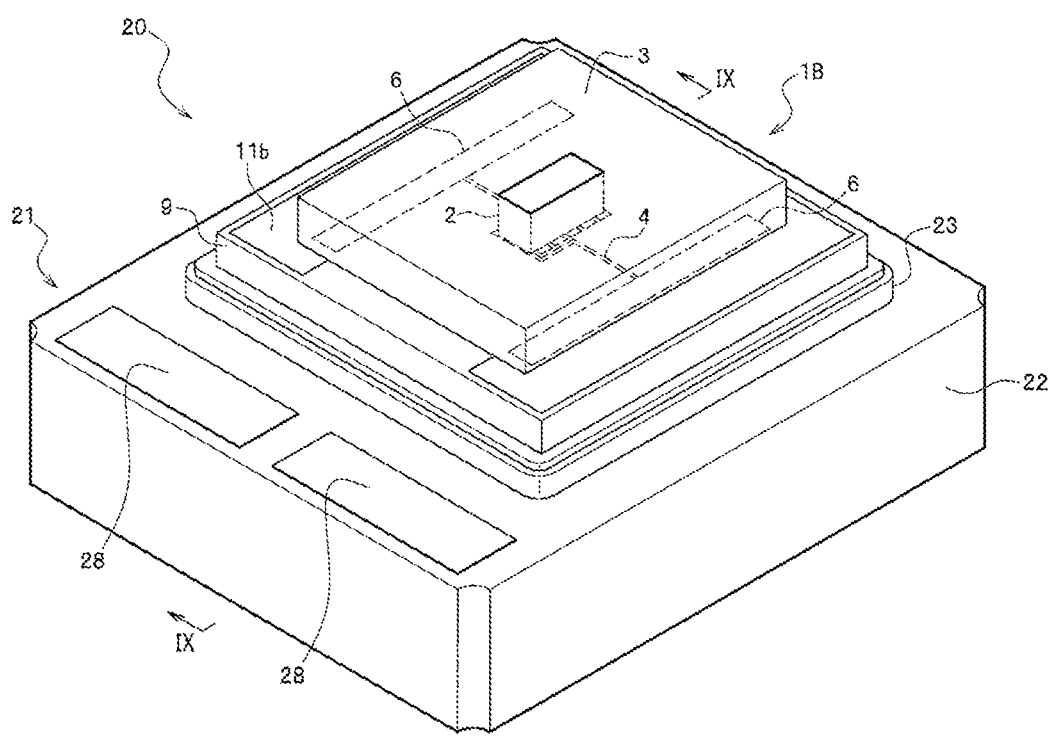
FIG. 6 is a schematic perspective diagram showing a configuration of a light emitting device using an optical member according to a second embodiment.

As shown in FIGS. 5A to 5C, the method of manufacturing an optical member includes the steps of: providing a sintered body; removing a part of a conversion member and a holding member; and forming a wiring. Hereinafter, steps in the method of manufacturing the optical member will be described.

(1) Providing Sintered Body

As shown in FIG. 5A, in the step of providing a sintered body, the conversion member 2 and the holding member 3 are brought into contact with each other to integrally form a sintered body 100. In one embodiment, a method of providing the sintered body 100 includes the steps of: providing the conversion member 2; forming a molded article that forms the holding member 3; and sintering the conversion member 2 and the molded article.

Generally, the sintered body refers to an article obtained by heating a powdered material at a temperature lower than the melting point thereof so as to harden the powdered material. However, even when the conversion member 2 composed of a molded article and the powdery holding member 3 that has not yet been sintered are heated, a sintering that is similar to a general sintering is considered to occur on the surface of the conversion member 2 and on the surface of the powdery holding member 3. Therefore, in this specification, an article made integrally from the conversion member 2 composed of a molded article and the powdery holding member 3 is also referred to as a "sintered body." Similarly, a product made integrally from the powdery conversion member 2 and the holding member 3 composed of a molded article is also referred to as a "sintered body."

As a sintering method, for example, a discharge plasma sintering method (SPS method: spark plasma sintering method) or a hot-pressing sintering method (HP method: hot pressing method) can be employed. When aluminum oxide (alumina) is used for the powdered holding member 3, the sintering temperature is preferably set to preferably 1200° C. or higher and 1800° C. or lower, more preferably 1400° C. or higher and 1500° C. or lower. With the sintering temperature of 1200° C. or higher, strength of the holding member 3 can be ensured. With the sintering temperature of 1800° C. or lower, the possibility of an increase in the light-transmissivity of the holding member 3 can be reduced.

(2) Removing a Part of Conversion Member and Holding Member

In the step of providing the sintered body, the upper surface of the conversion member 2 is covered with the holding member 3. Thus, as shown in FIG. 5B, a portion of the conversion member 2 and the holding member 3 is removed from upper surface side of the sintered body 100 until the conversion member 2 is exposed. Accordingly, as shown in FIG. 5C, the conversion member 2 having a first surface as the light extraction surface 2a, and the holding member 3 having the surface 3a (second surface) continuous with the first surface of the conversion member 2 are obtained when the sintered body 100 is divided.

Examples of a method of removing a portion of the sintered body 100 include grinding, polishing, chemical-mechanical planarization (CMP) and the like. In this method of manufacturing, the sintered body 100 is removed only from one side. However, alternatively, for removing deposits on the lower surface of the conversion member 2 and the lower surface of the holding member 3, a portion of the sintered body 100 may be removed from the lower surface side, followed by removing the holding member 3 of the sintered body 100 from the upper surface side.

At the time of dividing the sintered body 100, the sintered body 100 is divided so that a single sintered body 100 includes a single conversion member 2. For example, by using one or more of a scribing technique, a dicing technique, and a breaking technique, the sintered body 100 can be divided into a plurality of sintered bodies 100. In this method of manufacturing, the sintered body 100 is divided so that a single sintered body 100 includes a single conversion member 2, but the sintered body 100 may alternatively be divided in such a manner that one sintered body 100 includes a plurality of conversion members 2.

(3) Forming Wiring

In the step of forming a wiring, the wiring 4 is formed to extend continuously along the light extraction surface 2a (i.e., first surface) of the conversion member 2 and the surface 3a (i.e., second surface) of the holding member 3. Examples of a method of forming the wiring 4 include a sputtering method, a chemical vapor deposition method and an atomic layer deposition method. By using the sintered body 100 in which the conversion member 2 and the holding member 3 are brought into contact with each other to be integrally molded, the wiring 4 extending continuously along the conversion member 2 and the holding member 3 can be formed. With the wiring 4 extending continuously along the light extraction surface 2a (i.e., first surface) of the conversion member 2 and the surface 3a (i.e., second surface) of the holding member 3, breakage in the vicinity of the boundary between the light extraction surface 2a (i.e., first surface) of the conversion member 2 and the surface 3a (i.e., second surface) of the holding member 3 can be detected by detecting breakage of the wiring 4. Thus, a defect that may cause leakage of laser light can be more accurately detected.

The method of manufacturing the optical member 1A includes bonding the heat dissipating member 9 and the holding member 3 to each other using the first metal layer 10 formed by a sputtering method or the like, after forming a wiring.

Second Embodiment

Next, an optical member, a light emitting device, and a method of manufacturing an optical member according to a second embodiment will be described.

As shown in FIGS. 6 to 9, an optical member 1B to be used for a light emitting device 20 includes a conversion member 2, a holding member 3 and a wiring 4. The optical member 1B preferably includes a heat dissipating member 9.

The light emitting device 20 preferably includes the optical member 1B, a laser element 25, and a package 21. The light emitting device 20 more preferably includes a detection circuit 30 similarly to the light emitting device 20 according to the first embodiment.

The constituent elements of the optical member 1B and the light emitting device 20 will be described. Configurations other than those shown below are the same as in the optical member 1A and light emitting device 20 shown in FIGS. 1 to 4.

Optical Member

In the optical member 1B, light-irradiated surface 2b the conversion member 2 at a back surface-side, which will be the heat dissipating member 9, is a first surface. The wiring 4 is disposed to be extend continuously along the light-irradiated surface 2b (i.e., first surface) and a back surface 3c (i.e., second surface) of the holding member 3, over boundaries therebetween. In other words, the wiring 4 is disposed between the conversion member 2 and the heat dissipating member 9 and between the holding member 3 and the heat dissipating member 9. With this arrangement of the wiring 4, breakage of the wiring 4 in the vicinity of the boundary between the conversion member 2 and the holding member 3 can be detected, and therefore a defect that may cause leakage of laser light can be more accurately detected. In addition, a surface of the conversion member 2 opposite to the light-irradiated surface 2b is the light extraction surface 2a from which light subjected to wavelength conversion is emitted. With the wiring 4 disposed on the light-irradiated surface 2b rather than the light extraction surface 2a as described above, light subjected to wavelength conversion and extracted from the conversion member 2 is not affected by the wiring 4, and therefore unevenness in brightness can be reduced.

In the optical member 1B, for bonding the holding member 3 and the heat dissipating member 9 to each other, a second metal layer 11 is used in addition to a first metal layer 10.

First Metal Layer

The first metal layer 10 includes a center-side first metal layer 10a and an end portion-side first metal layers 10b, and serves to bond the holding member 3 and the heat dissipating member 9 to each other. A material and a thickness of each of the center-side first metal layer 10a and the end portion-side first metal layers 10b are the same as a material and a thickness of the first metal layer 10 of the optical member 1A.

Figure 7:
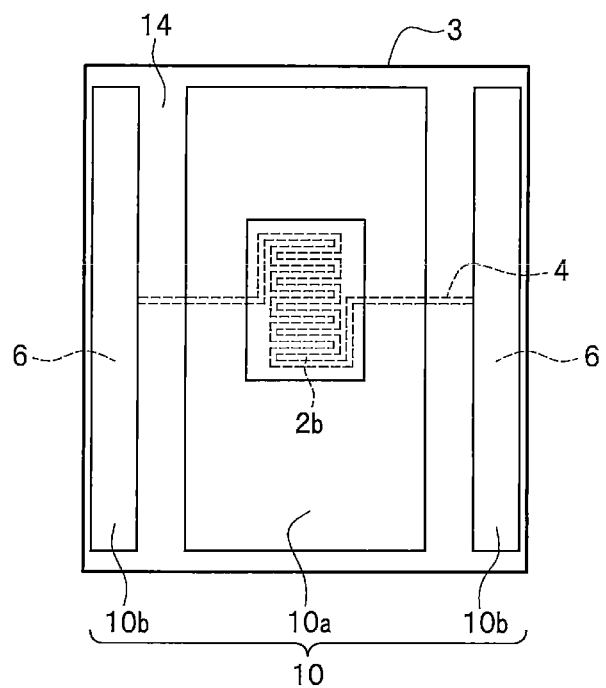
FIG. 7 is a schematic bottom view of a holding member in FIG. 6.
Figure 8:
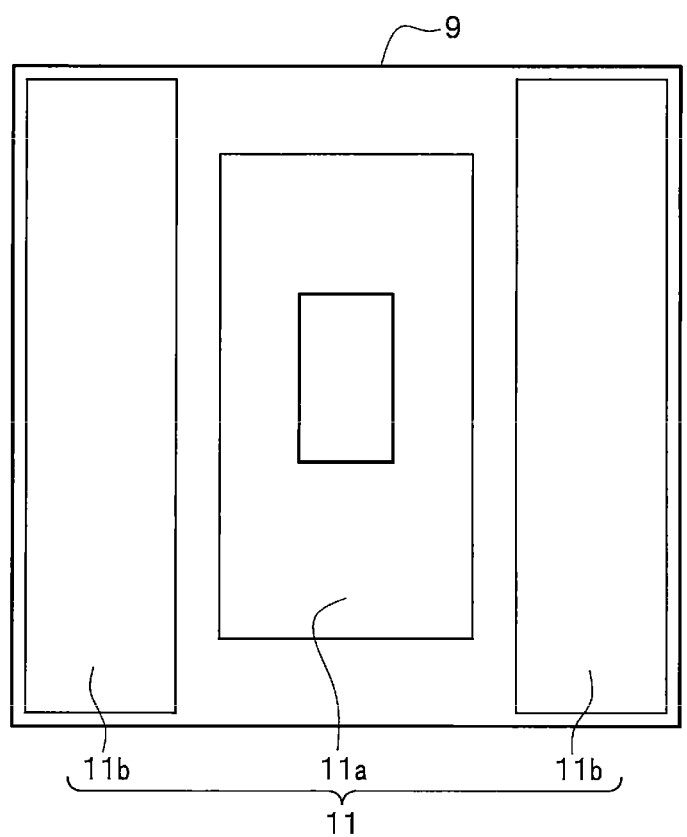
FIG. 8 is a schematic plan view of a heat dissipating member in FIG. 6.

The center-side first metal layer 10a has a substantially rectangular ring shape at the center of the back surface 3c (i.e., second surface) of the holding member 3 to surround the wiring 4 disposed on the light-irradiated surface 2b (i.e., first surface) of the conversion member 2 in a plan view. When the center-side first metal layer 10a is electrically connected to the wiring 4, it is difficult to detect breakage of the wiring 4. Thus, the center-side first metal layer 10a is insulated from the wiring 4 by an insulating film 14 disposed between the center-side first metal layer 10a and the wiring 4. The smaller the area of a portion where the center-side first metal layer 10a and the wiring 4 overlap each other in a plan view, the smaller the possibility of leakage between the center-side first metal layer 10a and the wiring 4 can be. Thus, it is preferable that the center-side first metal layer 10a and the wiring 4 overlap each other at two portions in a plan view as shown in FIG. 7. For obtaining such an arrangement, the center-side first metal layer 10a may be disposed outside a bent portion 5a of the wiring 4.

The end portion-side first metal layers 10b are disposed spaced apart from the center of the back surface 3c, on which the center-side first metal layer 10a is disposed, at a left side and a right side thereof to cover two electricity supplying portions 6 for supplying the wiring 4 with electricity, and each of the end portion-side first metal layers 10b has a substantially rectangular shape in a plan view. Each of the two end portion-side first metal layers 10b is electrically connected to the wiring 4, and serve as an anode and a cathode for the wiring 4.

Second Metal Layer

The second metal layer 11 includes a center-side second metal layer 11a and an end portion-side second metal layer 11b. A material and a thickness of each of the center-side second metal layer 11a and the end portion-side second metal layers 11b are the same as a material and a thickness of the second metal layer 11 of the optical member 1A.

The center-side second metal layer 11a is disposed on the center side of a surface of the heat dissipating member 9 facing the holding member 3, to cover the center-side first metal layer 10a disposed on the back surface 3c (second surface). Similarly to the center-side first metal layer 10a, the center-side second metal layer 11a has a rectangular ring shape surrounding the wiring 4.

The end portion-side second metal layers 11b are disposed at a left side and a right side of a surface of the heat dissipating member 9 facing the holding member 3 to be spaced apart from the center-side second metal layer 11a, and each of the end portion-side second metal layers 11b has a substantially rectangular shape. At the left and right sides, each of the end portion-side second metal layers 11b has a rectangular shape having a size that allows each of the end portion-side second metal layers 11b partially protrude outward of the holding member 3 in a plan view at the time of bonding the holding member 3 and the heat dissipating member 9 to each other. Each of the two end portion-side second metal layers 11b is electrically connected to the electricity supplying portion 6 (i.e., a respective one of the end portion-side first metal layers 10b) to serve to supply electricity to the electricity supplying portion 6 of the wiring 4 from the outside, in addition to bonding the holding member 3 and the heat dissipating member 9 to each other. Thus, the end portion-side second metal layers 11b are disposed so as to be partially exposed from the holding member 3 in a plan view after bonding. This allows for connecting a wire or the like to the portion of each of the end portion-side second metal layers 11b exposed from the holding member 3. With the end portion-side second metal layers 11b to be connected to the outside disposed outward of the center-side second metal layer 11a as described above, the end portion-side second metal layers 11b is easily drawn outward.

The center-side first metal layer 10a and the center-side second metal layer 11a are formed to surround the light-irradiated surface 2b (first surface) of the conversion member 2 together with the heat dissipating member 9. Thus, deposition of dust on the light-irradiated surface 2b (first surface) of the conversion member 2 can be effectively prevented. For obtaining this effect, the shape of each of the center-side first metal layer 10a and the center-side second metal layer 11a in a plan view is preferably a ring shape. Further, for increasing the bonding area as much as possible, it is preferable that each of the center-side first metal layer 10a and the center-side second metal layer 11a has a shape corresponding to the outer edge of the holding member 3 and the shape of the wiring 4. For example, when the holding member has a circular shape, each of the center-side first metal layer 10a and the center-side second metal layer 11a may have a circular ring shape.

Since the optical member 1b includes the second metal layer 11, an external electrode or a circuit can be easily connected to the wiring 4 even when the wiring 4 is disposed between the conversion member 2 and holding member 3 and the heat dissipating member 9.

Insulating Film

The insulating film 14 is a film which insulates the center-side first metal layer 10a and the wiring 4 from each other. The insulating film 14 is disposed on at least a portion where the center-side first metal layer 10a and the wiring 4 overlap each other in a plan view. When the insulating film 14 is also disposed on a path of laser light, the insulating film 14 is preferably light-transmissive. The insulating film 14 can cover the light-irradiated surface 2b (first surface) of the conversion member 2 except a region provided with two electricity supplying portions 6 for supplying the wiring 4 with electricity, and an entirety of the wiring 4 and an entirety of the back surface 3c (second surface) of the holding member 3. The insulating film 14 may also serve as a protective film 8 in a variant example of the first embodiment as described below. A material and a thickness of the insulating film 14 may be the same as a material and a thickness of the protective film 8.

Light Emitting Device

Figure 9:
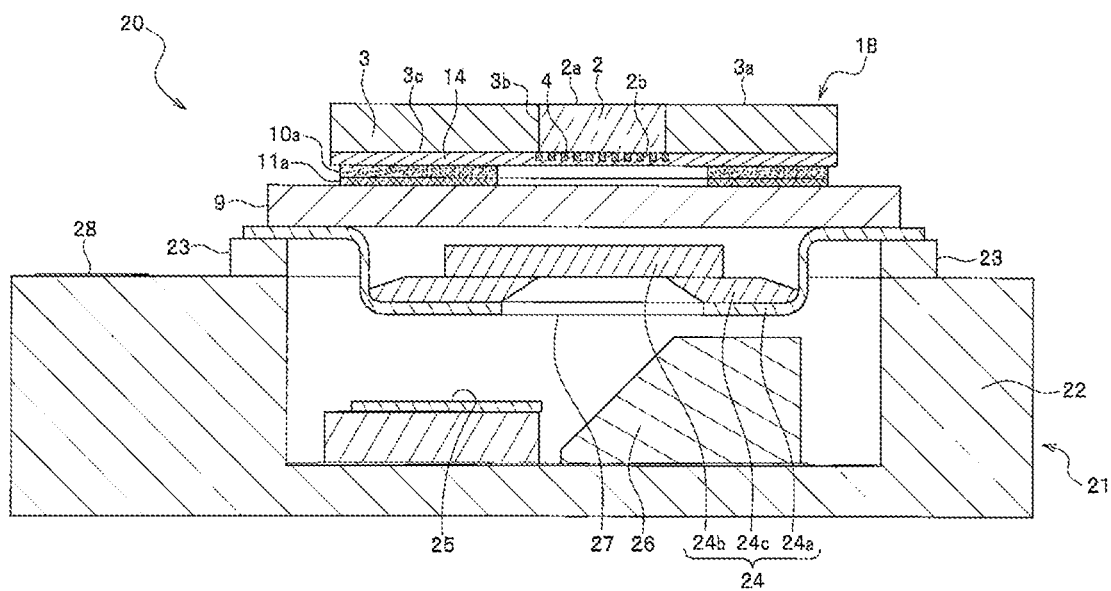
FIG. 9 is a schematic cross-sectional view taken along line IX-IX in FIG. 6.
Figure 10:
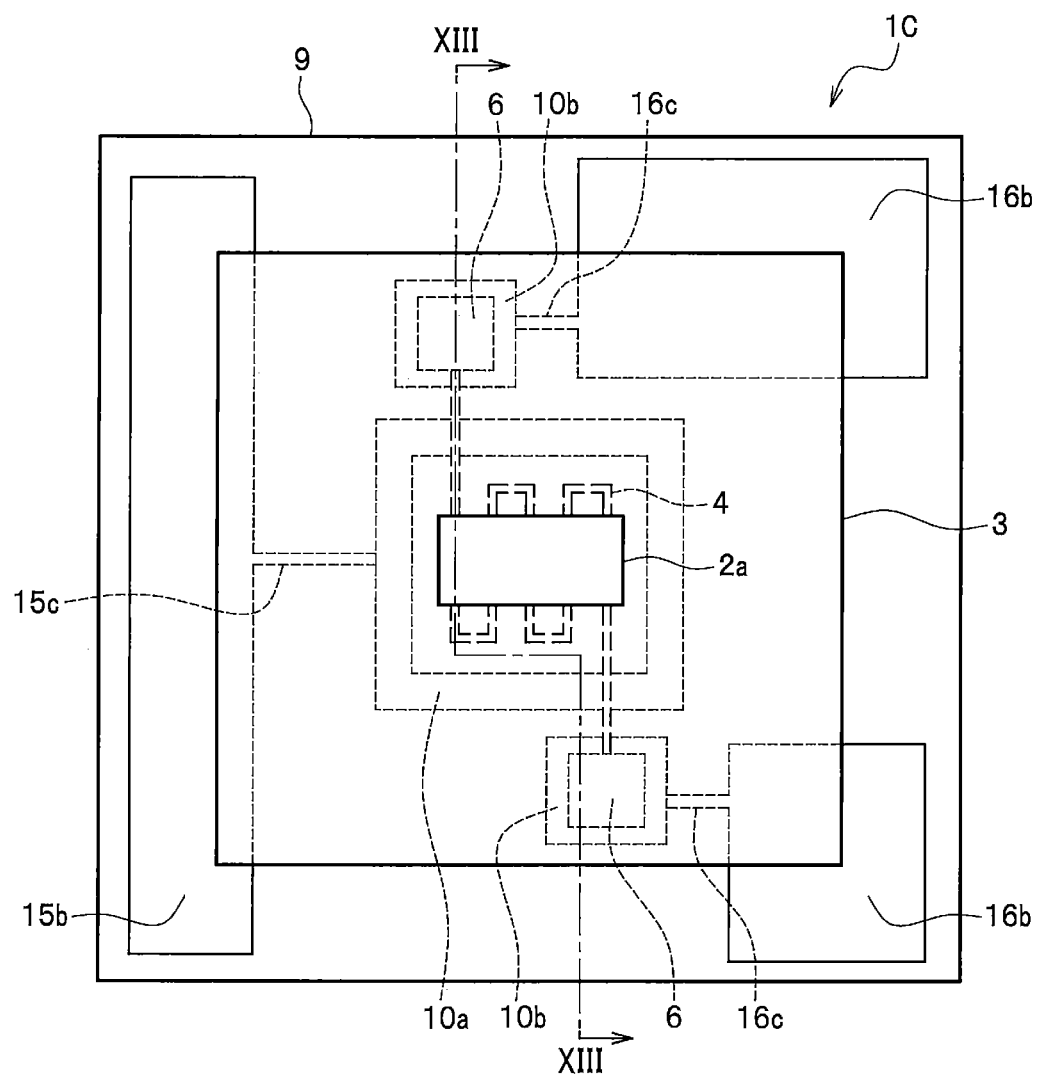
FIG. 10 is a schematic plan view showing a light extraction surface-side of a configuration of an optical member according to a third embodiment.
Figure 11:
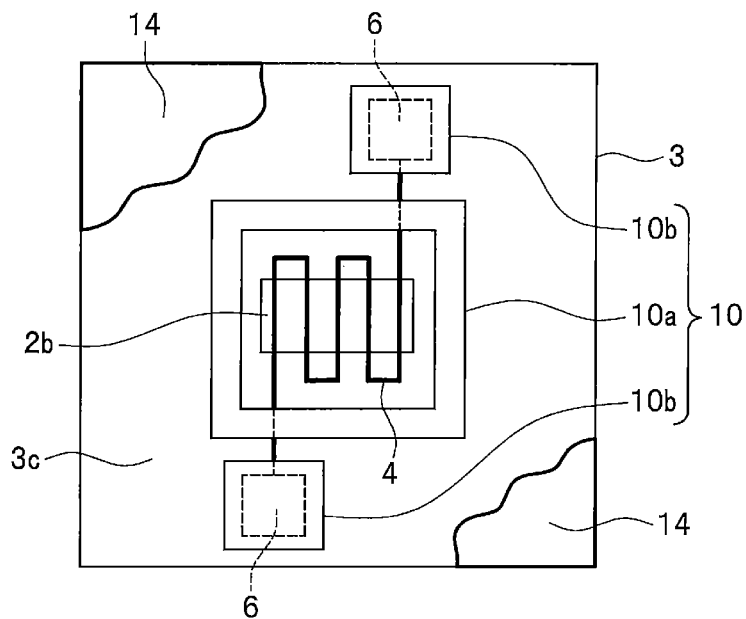
FIG. 11 is a schematic bottom view of a holding member in FIG. 10.
Figure 12:
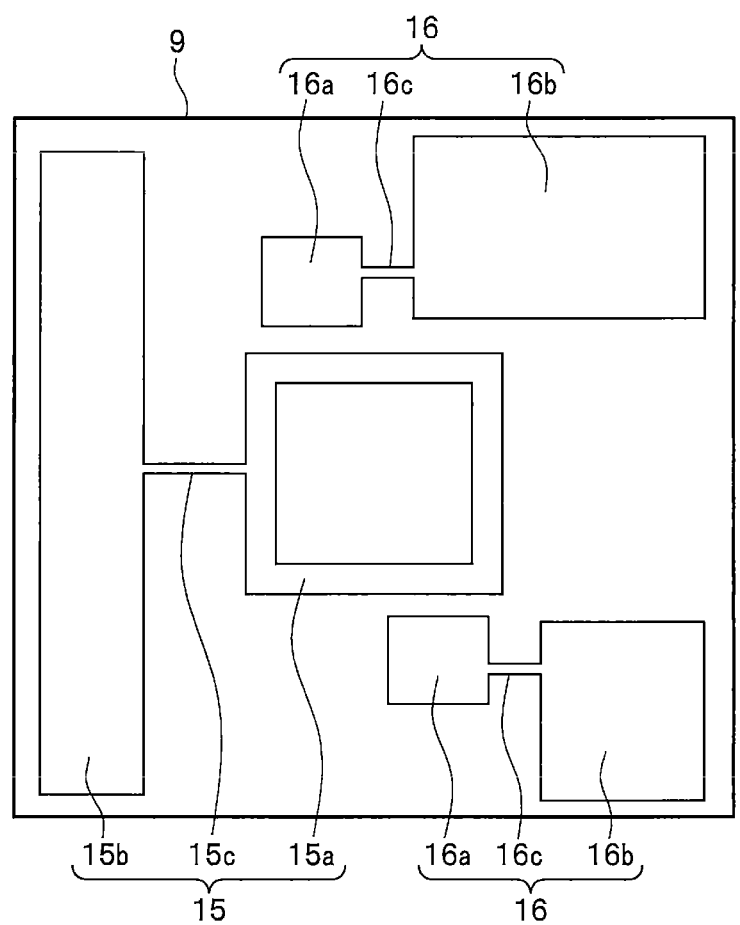
FIG. 12 is a schematic plan view of a heat dissipating member in FIG. 10.
Figure 13:
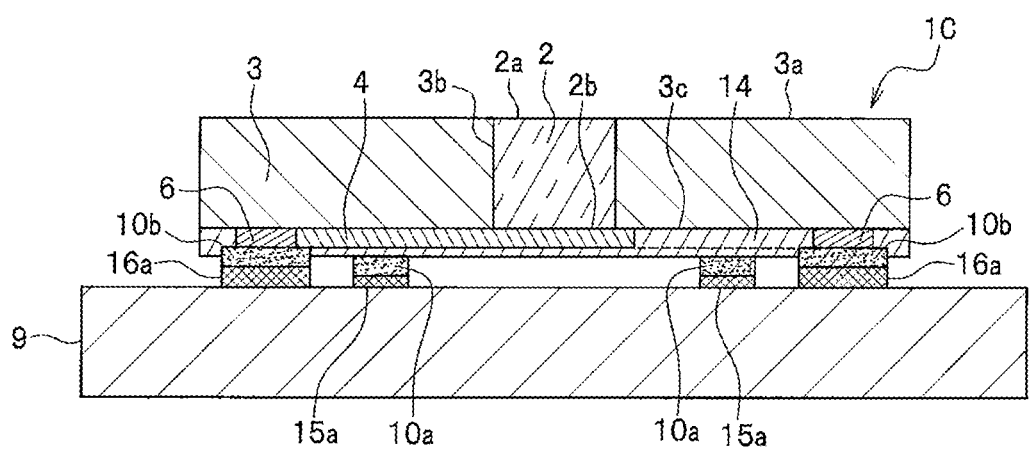
FIG. 13 is a schematic cross-sectional view taken along line XIII-XIII in FIG. 10.

The light emitting device 20 is the same as in the first embodiment except that in the light emitting device 20 using the optical member 1A in the first embodiment (see FIG. 3), the optical member 1B is used in place of the optical member 1A as shown in FIG. 9. In the light emitting device 20 having such a configuration, using the optical member 1B allows for reducing unevenness in brightness of extracted light.

Method of Manufacturing Optical Member

The optical member 1B can be manufactured by the same manufacturing method as in the first embodiment. In the optical member 1B, the light-irradiated surface 2b of the conversion member 2 is a first surface that is provided with the wiring 4. The method of manufacturing the optical member 1B includes, after forming a wiring, bonding the heat dissipating member 9 and the holding member 3 to each other using the center-side first metal layer 10a and end portion-side first metal layers 10b and the center-side second metal layer 11a and end portion-side second metal layers 11b, which are formed by a sputtering method or the like.

Third Embodiment

Next, an optical member, a light emitting device, and a method of manufacturing an optical member according to a third embodiment will be described.

A part of an optical member 1C according to the third embodiment is different from a corresponding part of the optical member 1B according to the second embodiment, as shown in FIGS. 10 to 13. More specifically, in the optical member 1C, instead of the center-side second metal layer 11a of the second metal layer 11 in the second embodiment, a leakage checking electrode 15, which has a shape different from a shape of the center-side second metal layer 11a in the second embodiment so as to partially expose the center-side second metal layer from a holding member 3 in a plan view, is disposed.

The optical member 1C includes a conversion member 2, the holding member 3, a wiring 4, a first metal layer 10, an insulating film 14, the leakage checking electrode 15, wiring electrodes 16 and a heat dissipating member 9.

It is preferable that a light emitting device 20 further includes the optical member 1C, a laser element 25, and a package 21. It is more preferable that the light emitting device 20 further includes a detection circuit 30.

The constituent elements of the optical member 1C will be described. Configurations other than those shown below are the same as in the optical member 1B shown in FIGS. 6 to 9.

Optical Member

Leakage Checking Electrode

The leakage checking electrode 15 includes a central portion 15a, and a terminal portion 15b connected to the central portion 15a through a linear connection portion 15c. The leakage checking electrode 15 is used for checking whether insulation between a center-side first metal layer 10a and the wiring 4 are secured after the holding member 3 and the heat dissipating member 9 are bonded to each other. The leakage checking electrode 15 is electrically connected to the center-side first metal layer 10a. Accordingly, whether or not leakage occurs between the center-side first metal layer 10a and the wiring 4 can be determined by, with the terminal portion 15b of the leakage checking electrode 15 being an anode, applying a voltage between the anode and the cathode side of the wiring electrodes 16, and checking whether or not a current passes therethrough. The anode and the cathode described above may be reversed.

The central portion 15a has a rectangular ring shape on the heat dissipating member 9 side such that the central portion 15a covers the center-side first metal layer 10a surrounding the conversion member 2 (first surface) in a plan view. The central portion 15a can have a size identical to that of the center-side first metal layer 10a. In addition, for establishing electrical connection to the outside, the terminal portion 15b has a size and disposed at a position that allow the terminal portion 15b to partially protrude outward of the holding member 3 in a plan view at the time of bonding the holding member 3 and the heat dissipating member 9 to each other. The terminal portion 15b is electrically connected to the central portion 15a through the connection portion 15c. The terminal portion 15b is disposed at the heat dissipating member 9 side and has a substantially oblong shape along one side of the heat dissipating member 9.

The central portion 15a, the connection portion 15c and the terminal portion 15b correspond to the center-side second metal layer 11a in the optical member 1B, and a material and a thickness thereof may be the same as a material and a thickness of the center-side second metal layer 11a in the optical member 1B. The central portion 15a, the connection portion 15c and the terminal portion 15b are also used for bonding the holding member 3 and the heat dissipating member 9 to each other.

Wiring Electrodes

The wiring electrodes 16 correspond to the end portion-side second metal layers 11b in the optical member 1B, and is different only in shape from the end portion-side second metal layers 11b, and a material and a thickness of the wiring electrode 16 may be the same as a material and a thickness of the end portion-side second metal layers 11b. Each of the wiring electrodes 16 includes a central portion 16a, and a terminal portion 16b connected to the central portion 16a through a linear connection portion 16c. The central portion 16a has a rectangular shape at the heat dissipating member 9 side with a size identical to that of the end portion-side first metal layer 10b for supplying the wiring 4 with electricity by electrically connecting the central portion 16a to each of two electricity supplying portions 6 through the end portion-side first metal layer 10b. The terminal portion 16b has a substantially rectangular shape and is disposed at a corner portion of the heat dissipating member 9 with a size and a position that allows the terminal portion 16b to partially protrude outward of the holding member 3 at the time of bonding the holding member 3 and the heat dissipating member 9 to each other. The central portion 16a and the terminal portion 16b are formed to be electrically connected to each other through the connection portion 16c. The central portion 16a, the connection portion 16c and the terminal portion 16b are also used for bonding the holding member 3 and the heat dissipating member 9 to each other.

Light Emitting Device

The light emitting device 20 is the same as in the second embodiment except that, in the light emitting device 20 using the optical member 1B of the second embodiment (see FIG. 9), the optical member 1C is used in place of the optical member 1B. The insulating film 14 is a film similar to the protective film 8 (see FIG. 14). The leakage checking electrode 15 (i.e., central portion 15a and terminal portion 15b) is a bonding layer similar to the center-side second metal layer 11a and the end portion-side second metal layer 11b (see FIGS. 8 and 9).

Method of Manufacturing Optical Member

The optical member 1C can be manufactured by the same manufacturing method as in the second embodiment. The method of manufacturing the optical member 1C may include, after forming a wiring, bonding the heat dissipating member 9 and the holding member 3 to each other using the center-side first metal layer 10a, end portion-side first metal layer 10b, the leakage checking electrode 15 (i.e., central portion 15a, connection portion 15c and terminal portion 15b), and the wiring electrode 16 (central portion 16a, connection portion 16c and terminal portion 16b), which are formed by a sputtering method or the like.

Variant Examples of First to Third Embodiments

Next, variant example of the configurations of the first to third embodiments will be described with reference to FIGS. 14 to 17C.

Optical Member

Variant examples of the optical member will be described.

Figure 14:
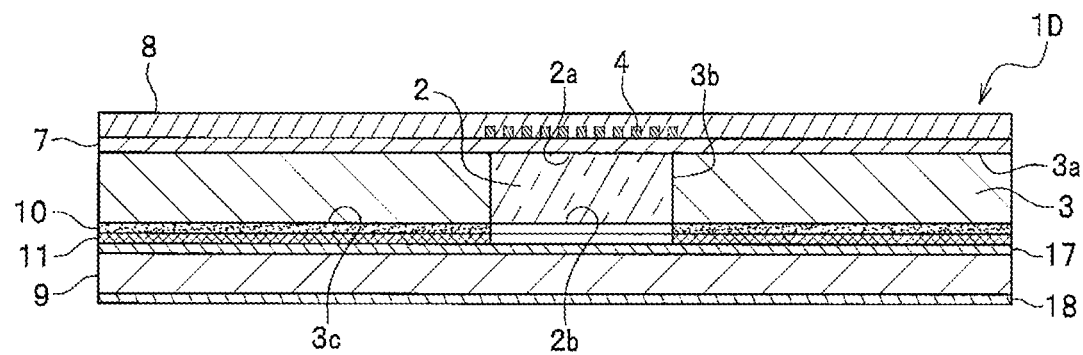
FIG. 14 is a schematic cross-sectional view showing a variant example of the optical member according to the first embodiment.

As shown in FIG. 14, an optical member 1D, which is a variant example of the optical member 1A according to the first embodiment, includes a conversion member 2, a holding member 3, a wiring 4, a light-transmissive film 7, a protective film 8, a heat dissipating member 9, a dielectric multilayer film 17 and an antireflection film 18. The optical member 1D may include one or more of the light-transmissive film 7, the protective film 8, the dielectric multilayer film 17, and the antireflection film 18. The conversion member 2, the holding member 3, the wiring 4 and the heat dissipating member 9 of the optical member 1D are the same as in the optical member 1A, and therefore descriptions thereof are omitted. The light-transmissive film 7, the protective film 8, the dielectric multilayer film 17 and the antireflection film 18 of the optical member 1D will be described below.

Light-Transmissive Film

The light-transmissive film 7 is a film covering a light extraction surface 2a (i.e., first surface) of the conversion member 2 and a surface 3a (i.e., second surface) of the holding member 3. With the light-transmissive film 7, the conversion member 2 and the holding member 3 can be covered by the light-transmissive film 7 having a surface with an improved flatness. With the light-transmissive film 7, the wiring 4 is not formed directly on a surface of the conversion member 2 and a surface of the holding member 3, but formed on a surface of the light-transmissive film 7. Therefore, the wiring 4 is formed on the surface of the light-transmissive film 7 having improved surface flatness as compared to the conversion member 2 and the holding member 3, so that the possibility that disconnection of the wiring 4 occur during formation can be reduced.

When the conversion member 2 is formed of two or more materials, and a surface of the conversion member 2 is subjected to a flattening treatment such as CMP, steps are easily generated on the surface due to variation in the removal rate between the materials. Thus, it is preferable to form the light-transmissive film 7 on the surface of the conversion member 2. Similarly, when the holding member 3 is made of a light reflecting ceramic, it is preferable to form the light-transmissive film 7 on a surface of the holding member 3 because a ceramic having a higher reflectivity tends to have a higher porosity, leading to deterioration of the flatness of the surface of the holding member 3.

The light-transmissive film 7 is made of a light-transmissive material. Examples of the light-transmissive material transmissive to visible light include materials containing silicon oxide such as $SiO_2$. The light-transmissive film 7 is, for example, a $SiO_2$ film. It is preferable that the light-transmissive film 7 has such a thickness that allows the flatness of the conversion member 2 and the holding member 3 to be improved.

More specifically, the thickness of the light-transmissive film 7 is preferably in a range of 1 μm to 15 μm. The light-transmissive film 7 may cover a light-irradiated surface 2b of the conversion member 2 and a back surface 3c of the holding member 3.

Protective Film

The protective film 8 is a light-transmissive film covering at least the light extraction surface 2a (first surface) of the conversion member 2 and the wiring 4. The protective film 8 preferably covers an entirety of the light extraction surface 2a (i.e., first surface). With the protective film 8, the wiring 4 can be protected so that the wiring 4 is not broken by an impact which is too small to break the conversion member 2. Further, light can be spread in the protective film 8, and thus it is thought that unevenness in brightness of light extracted through the protective film 8 from the conversion member 2 can be improved.

A thickness of the protective film 8 is equal to or greater than the wavelength of excitation light (e.g., 450 nm) and equal to or less than 20 μm.

Like the light-transmissive film 7, the protective film 8 is made of a light-transmissive material. Examples of the light-transmissive material transmissive to visible light include materials containing silicon oxide such as $SiO_2$. The protective film 8 is, for example, $SiO_2$.

When the wiring 4 is light-transmissive, it is preferable that the refractive index of the protective film 8 is close to the refractive index of the wiring 4, and the protective film 8 is disposed in at least a region which is not provided with the wiring 4. This allows for reducing difference in refractive index between a region provided with the wiring 4 and a region which is not provided with the wiring 4, so that unevenness in brightness can be reduced. Because silicon oxide such as $SiO_2$ has a refractive index lower than that of a conductive oxide film of ITO or the like, it is preferable that the protective film 8 contains silicon oxide and a material having a refractive index higher than that of silicon oxide. Thus, with the protective film 8 containing a material having a high refractive index, unevenness in brightness can be reduced as described above. More specifically, it is preferable that a material in which a predetermined amount of tantalum oxide is mixed with silicon oxide is used for the protective film 8. The protective film 8 may be, for example, a film in which $SiO_2$ and $Ta_2O_5$ are mixed. When the wiring 4 is made of ITO, a mixed film of $SiO_2$ and $Ta_2O_5$ with a $SiO_2$ content of about 25 to 35% by weight is suitable for the protective film 8.

Dielectric Multilayer Film

The dielectric multilayer film 17 is a multilayer film disposed on an upper surface of the heat dissipating member 9, which is located at a conversion member 2-and-holding member 3 side. The dielectric multilayer film 17 is a film in which two or more dielectric films having different refractive indices and each including a dielectric material such as, for example, aluminum nitride, silicon oxide, aluminum oxide, zirconium oxide, titanium oxide, niobium oxide and tantalum oxide and having different refractive indices are layered to be multi-layers. The dielectric multilayer film 17 is a film that transmits laser light from the laser element 25, and reflects wavelength-converted light emitted from the light-irradiated surface 2b of the conversion member 2. In other words, the dielectric multilayer film 17 is a film having a reflectance with respect to light subjected to wavelength conversion in the conversion member 2 higher than a reflectance to excitation light (i.e., laser light from the laser element 25). Accordingly, light passing from the conversion member 2 toward the laser element 25 can be reflected, and returned to the conversion member 2, and therefore the light extraction efficiency from the light extraction surface 2a of the conversion member 2 can be improved. A thickness of the dielectric multilayer film 17 may be in a range of, for example, 1 to 10 μm.

Antireflection Film

The antireflection film 18 is a film is disposed on a lower surface, which is a surface on which laser light is incident, of the heat dissipating member 9. The antireflection film 18 is made of a dielectric material containing as a main component at least one selected from, for example, aluminum nitride, silicon oxide, aluminum oxide, zirconium oxide, titanium oxide, niobium oxide and tantalum oxide. The antireflection film 18 is a film in which a thickness, a composition ratio and the like are adjusted to obtain a greatly small reflectance, such as 1% or less, to laser light emitted from the laser element 25. With the antireflection film 18, the amount of laser light enters the conversion member 2 can be increased. A thickness of the antireflection film 18 may be in a range of, for example, 0.2 μm to 1 μm.

Variant Examples of Optical Members According to Second and Third Embodiments

Figure 15:
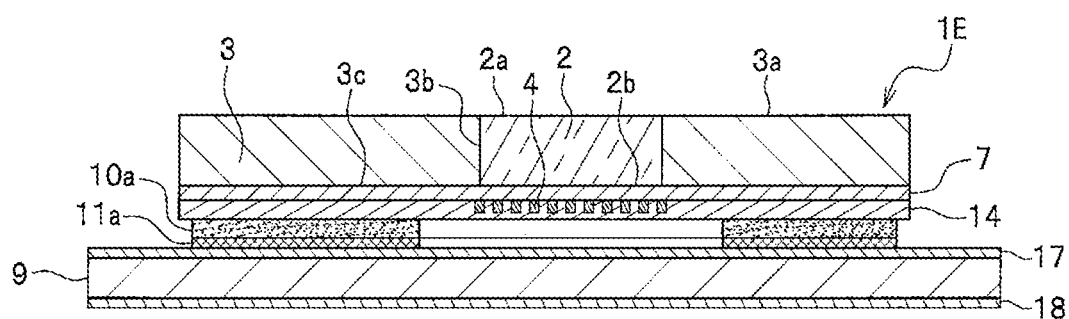
FIG. 15 is a schematic cross-sectional view showing a variant example of the optical member according to the second embodiment.
Figure 16:
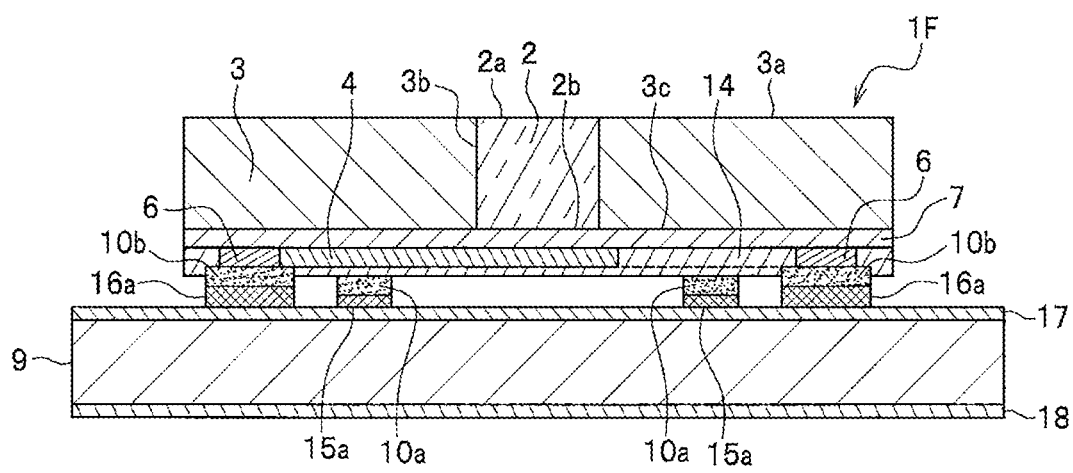
FIG. 16 is a schematic cross-sectional view showing a variant example of the optical member according to the third embodiment.

As shown in FIG. 15, an optical member 1E, which is a variant example of the optical member 1B according to the second embodiment, includes a conversion member 2, a holding member 3, a wiring 4, a light-transmissive film 7, a heat dissipating member 9, a dielectric multilayer film 17 and an antireflection film 18. As shown in FIG. 16, an optical member 1F, which is a variant example of the optical member 1C according to the third embodiment, includes a conversion member 2, a holding member 3, a wiring 4, a light-transmissive film 7, a heat dissipating member 9, a dielectric multilayer film 17 and an antireflection film 18.

Thus, in an optical member in which the wiring 4 is disposed at the light-irradiated surface 2b side, one or more of the light-transmissive film 7, the protective film 8, the dielectric multilayer film 17 and the antireflection film 18 can be provided. The conversion member 2, the holding member 3, the wiring 4 and the heat dissipating member 9 in each of the optical members 1E and 1F are the same as in the optical member 1B. The light-transmissive film 7, the dielectric multilayer film 17 and the antireflection film 18 in each of the optical members 1E and 1F are the same as in the optical member 1D. In each of the optical members 1E and 1F, the light-transmissive film 7 covers a light-irradiated surface 2b (i.e., first surface) of the conversion member 2 and a back surface 3c (i.e., second surface) of the holding member 3. With the light-transmissive film 7 covering surfaces at a wiring 4 side (i.e., light-irradiated surface 2b and back surface 3c), the possibility that disconnection of the wiring 4 occur during formation can be reduced as described above. The light-transmissive film 7 may be disposed to cover a light extraction surface 2a of the conversion member 2 and a surface 3a of the holding member 3.

Shape of Wiring

Figure 17A:
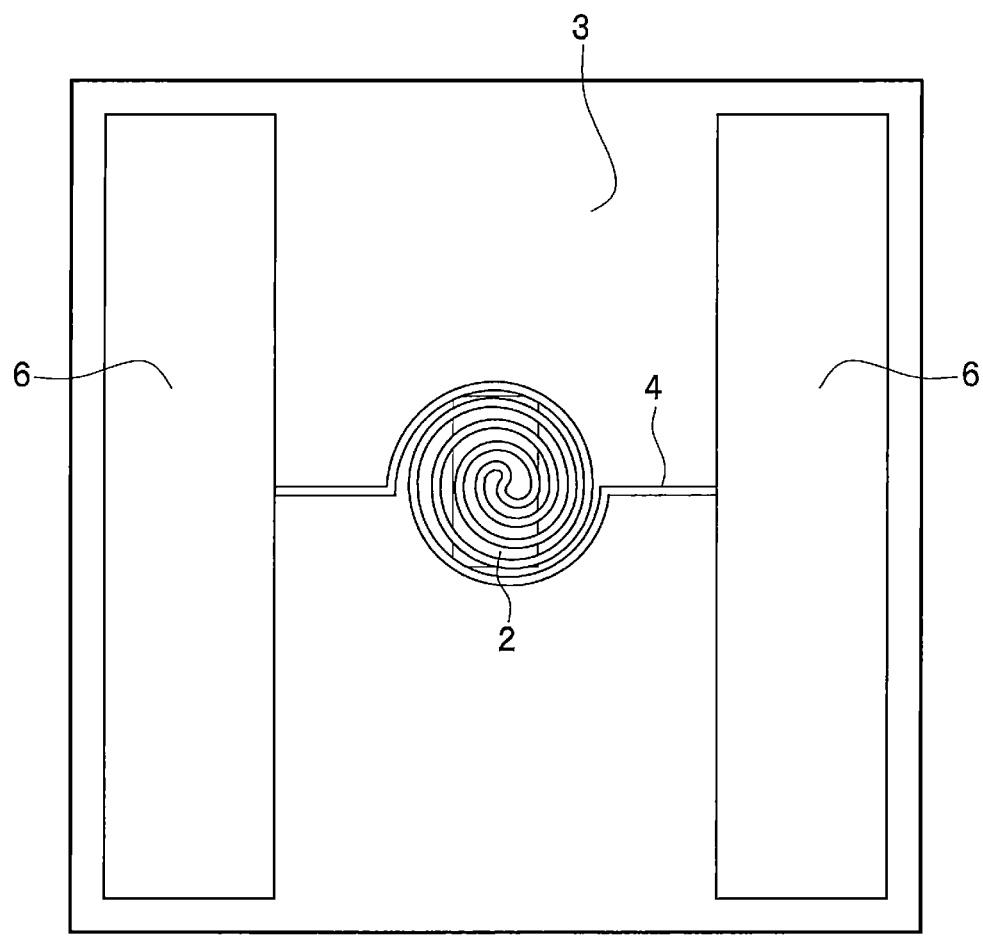
FIG. 17A is a schematic plan view showing a variant example of the optical member according to the first embodiment when viewed from the light extraction surface-side.

As shown in FIG. 17A, the wiring 4 shown in each of the embodiments and modifications may have a spiral shape in a plan view. A portion of the spiral-shaped portion of the wiring 4 covers the conversion member 2, and another portion thereof is formed on the holding member 3. The number of turns and the pitch in the spiral shape are appropriately selected in consideration of the size of a through-hole 3b of the holding member 3, and the width of the wiring 4. With the wiring 4 having a zigzag shape as shown in FIG. 2, for example, cracks extending laterally in FIG. 2 in the conversion member 2, may cause breakage of the conversion member 2 without breaking the wiring 4. However, with the wiring 4 having a spiral shape as shown in FIG. 17A, either cracks extending laterally or cracks extending vertically in the figure causes breakage in the wiring 4, so that a defect can be detected. The pitch of the spiral shape is preferably 60 μm or less, which allows for more accurately detecting a defect. The pitch of the spiral shape refers to, in other words, a width of a passage portion, which is a portion that is not provided with the wiring 4. The pitch of the spiral shape is preferably 5 μm or more so that the passage portion is not collapsed during formation of the wiring 4.

Figure 17B:
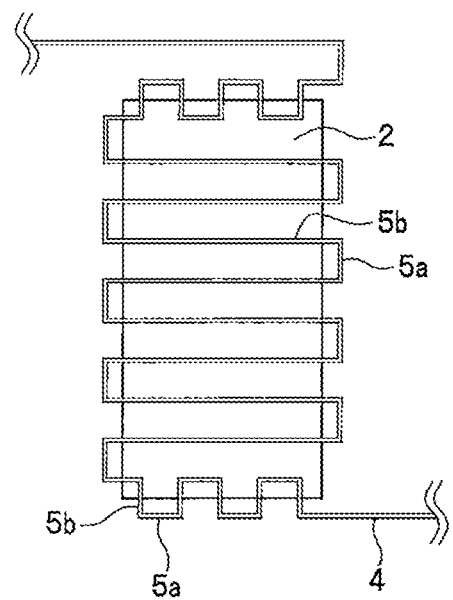
FIG. 17B is a partial enlarged view schematically showing a variant example of the optical member according to the first embodiment.

As shown in FIG. 17B, the wiring 4 shown in each of the first to third embodiments and their variant examples may have a shape in which an outermost extending portion 5*b* extends further in a direction different from that of an inner extending portion 5*b* in a plan view. In the wiring 4 shown in FIGS. 1 to 3, the outermost extending portion 5*b* among extending portions 5*b* extending in a single direction overlaps the boundary between the conversion member 2 and the holding member 3 in a plan view. When the optical member is manufactured with such a shape, the acceptable degree of displacement of the extending portion 5*b* in the widthwise direction is equal to or less than a width of the outermost extending portion, and when displacement at larger than a width of the outermost extending portion, the outermost extending portion 5*b* does not overlap the boundary between the conversion member 2 and the holding member 3. On the other hand, with the wiring 4 having a shape in which the inner extending portions 5*b* extends in a first direction, and the outermost extending portions 5*b*, which are located at both sides of the inner extending portions 5*b*, extends further in a second direction as shown in FIG. 17B, the acceptable degree of displacement may be greater than the width of the wiring 4. Each of the bent portions connects corresponding ones of the extending portions 5*b*, and consequently, the wiring 4 has a one-stroke-drawn shape.

Figure 17C:
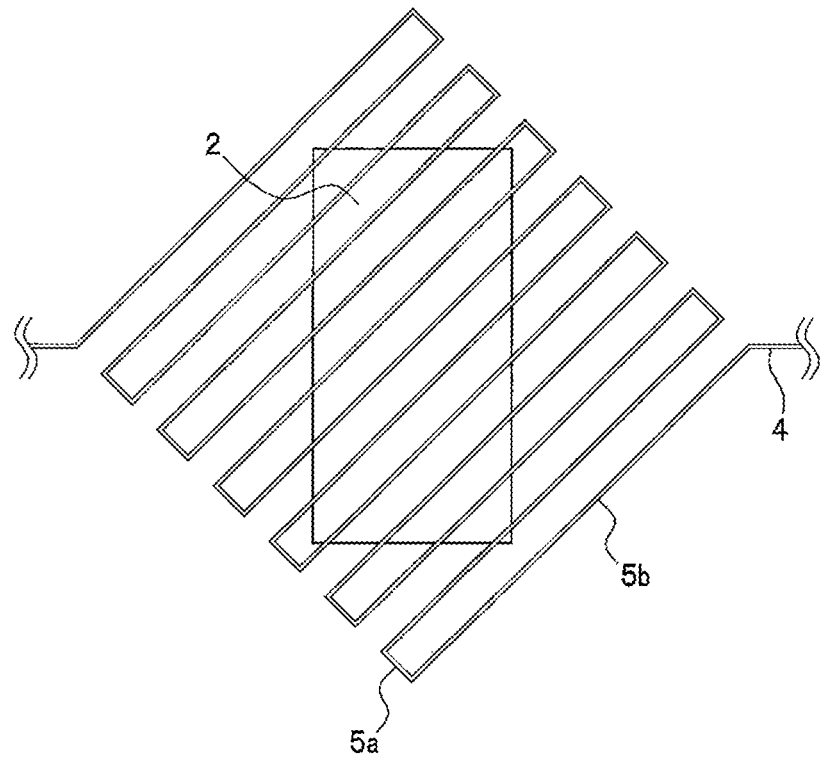
FIG. 17C is a partial enlarged view schematically showing a variant example of the optical member according to the first embodiment.

When the conversion member 2 has a polygonal shape in a plan view, as shown in FIG. 17C, the wiring 4 shown in each of the first to third embodiments and variant examples thereof may have a one-stroke-drawn shape having a plurality of extending portions 5*b* extending in a direction crossing all the sides forming the outer periphery of the conversion member 2, and the bent portions 5*a* each connecting corresponding adjacent ones of the extending portions 5*b*. Accordingly, the acceptable degree of displacement of the wiring 4 with respect to the boundary between the conversion member 2 and the holding member 3 can be expanded as compared to the case of the wiring 4 shown in FIGS. 1 to 3, while portions other than the bent portions 5*a* in the wiring 4 overlapping the conversion member 2 extend only in a single direction.

Each of the bent portions 5*a* has a linear shape, but may alternatively have a curved-line shape, for example, forming a semicircle. Each of the extending portion 5*b* also has a linear shape, but it may alternatively have a shape other than a linear shape, such as a shape of repeated linear irregularities or repeated curved irregularities.

Method of Manufacturing Optical Member

Next, varied examples of the method of manufacturing an optical member will be described.

A varied example of the method of manufacturing the optical member 1A according to the first embodiment includes the steps of: (1) providing a sintered body; (2) removing a portion of a conversion member and a portion of a holding member; (A) performing a heat treatment; (B) forming a light-transmissive film; and (3) forming a wiring.

In the modification, the steps of (1) to (3) are the same as in the above-described manufacturing method, and descriptions thereof are omitted.

The steps of (A) and (B) will be described below. These configurations are similar in a varied example of the method of manufacturing the optical member 1B or 1C according to the second or third embodiments.

(A) Performing Heat Treatment

The light extraction surface 2*a* (i.e., first surface) of the conversion member 2 and the surface 3*a* (i.e., second surface) of the holding member 3 of the holding member 3 are subjected to a heat treatment between the step of removing a part of the conversion member 2 and the holding member 3 and the step of forming the wiring 4. The heat treatment is performed preferably at 300° C. or higher, more preferably at 800° C. or higher, in the air. By performing the heat treatment, organic substances remaining in voids of a sintered body that forms the holding member 3 can be removed. When organic substances remain in voids of the holding member 3, the holding member 3 is heated while at least a part of a pathway through which the organic substances are discharged is blocked by the wiring 4 etc., in the subsequent steps, so that the remaining organic substances are blackened, resulting in occurrence of an appearance defect in the holding member 3. Thus, by performing the heat treatment before formation of the wiring 4 etc., the amount of remaining organic substances in the holding member 3 can be reduced, so that the possibility of occurrence of an appearance defect in the holding member 3 can be reduced. The heat treatment temperature is preferably lower than the sintering temperature of the sintered body that forms the holding member 3. This allows for reducing the possibility of occurrence of shrinkage, warpage, and the like of a material of the sintered body due to re-sintering, caused by the heat treatment. For example, the heat treatment is preferably performed at a temperature of 1200° C. or lower.

(B) Forming Light-Transmissive Film

Between the step of performing a heat treatment and the step of forming the wiring 4, the light-transmissive film 7 is formed to cover the light extraction surface 2*a* (i.e., first surface) of the conversion member 2 and the surface 3*a* (i.e., second surface) of the holding member 3, which have been subjected to the heat treatment. The light-transmissive film 7 can be formed by a sputtering method, a chemical vapor deposition method, an atomic layer deposition method, or the like. The light-transmissive film 7 may alternatively be formed on the light-irradiated surface 2*b*, which is a surface opposite to the first surface, of the conversion member 2 and on the back surface 3*c*, which is opposite to the second surface, of the holding member 3 after the heat treatment.

By formation of the light-transmissive film 7, organic substances can be prevented from re-penetrating into voids in a material that forms the holding member 3. Thus, the possibility of occurrence of an appearance defect in the holding member 3 due to blackening of remaining organic substances can be reduced. For preventing organic substances from re-penetrating, it is preferable that the light-transmissive film 7 has a large thickness, and can cover the surface of the holding member 3 without a break. Thus, it is preferable that the light-transmissive film 7 is deposited by a chemical vapor deposition method, and then deposited by an atomic layer deposition method. For formation of the light-transmissive film 7, for example, a $SiO_2$ film having a thickness of 5 μm is first formed by a chemical vapor deposition method, and a $SiO_2/Al_2O_3$ multilayer film having a thickness of 1 μm is then formed using an atomic layer deposition method. As described above, the conversion member 2 and the holding member 3 can be covered by the light-transmissive film 7 having a surface with an improved flatness, and therefore it is possible to reduce the possibility that the wiring 4 is broken during formation.

The method of manufacturing an optical member according to the first embodiment may further include forming the protective film 8 by using a sputtering method, a chemical vapor deposition method, an atomic layer deposition method or the like so as to cover the light extraction surface 2*a*, on which the light-transmissive film 7 is disposed, and to cover the wiring 4 as shown in FIG. 14, between the step of forming the wiring 4 and the step of disposing the heat dissipating member 9. The method of manufacturing an optical member according to the second or third embodiment may further include a step of forming the insulating film 14 by a sputtering method, a chemical vapor deposition method, an atomic layer deposition method, or the like so as to cover the light-irradiated surface 2b provided with the light-transmissive film 7 and cover the wiring 4 as shown in FIGS. 15 and 16, between the step of forming the wiring 4 and the step of disposing the heat dissipating member 9.

Other Methods of Manufacturing Sintered Body

In the methods of manufacturing an optical member according to the first to third embodiments, the sintered body may be provided by first to third methods of manufacturing described below.

The first to third methods of manufacturing the sintered body will be described in the case where the optical member 1A is manufactured in which the light extraction surface 2a of the conversion member 2 is a first surface provided with the wiring 4 as an example, and the same applies to a case where the optical member 1B or 1C is manufactured in which the light-irradiated surface 2b of the conversion member 2 is a first surface, on which the wiring 4 is to be disposed.

In the descriptions of the first to third methods of manufacturing the sintered body described below, for example, the expressions "powdered conversion member" and "conversion member composed of sintered body" are used, and the expression "conversion member" is used for a conversion member irrespective of the state thereof. Similarly, in the descriptions of the first to third methods of manufacturing the sintered body described below, for example, the expressions "powdered holding member" and "holding member composed of sintered body" are used, and the expression "holding member" is used for a holding member irrespective of the state thereof.

First Method of Manufacturing the Sintered Body

The first method of manufacturing a sintered body will be described.

(1) Obtaining Sintered Body

Figure 18A:
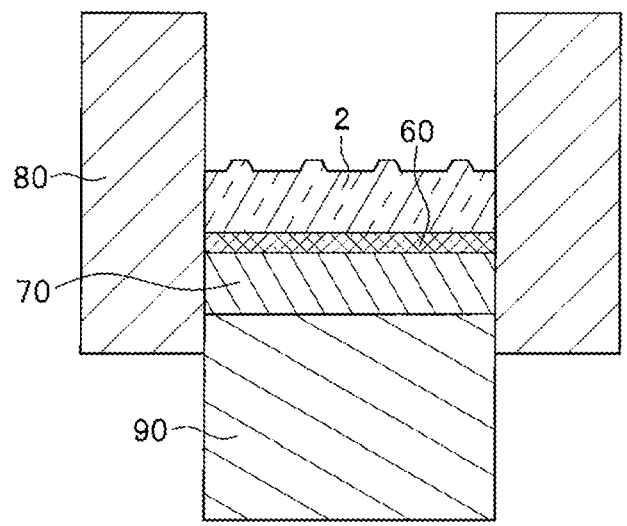
FIG. 18A is a schematic diagram for illustrating a first method of manufacturing a sintered body.
Figure 18B:
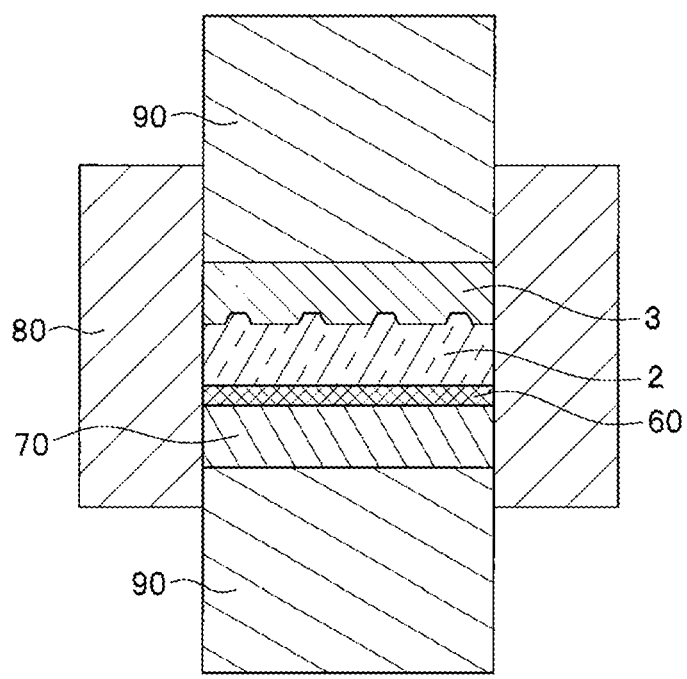
FIG. 18B is a schematic diagram for illustrating the first method of manufacturing a sintered body.
Figure 18C:
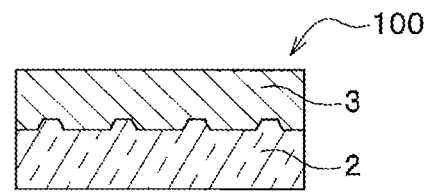
FIG. 18C is a schematic diagram for illustrating the first method of manufacturing a sintered body.

As shown in FIGS. 18A to 18C, in the step of obtaining a sintered body, the conversion member 2 and the holding member 3 are brought into contact with each other to be integrally molded, which allows for obtaining a sintered body 100. More specifically, the step of obtaining the sintered body includes: providing the conversion member 2; disposing the holding member 3; and providing the sintered body 100.

(1-1) Preparing Conversion Member

As shown in FIG. 18A, a powdered material (e.g., the same material as that of the holding member 3) is disposed as a buffer member 70 in a container before providing the conversion member 2. In this manufacturing method, a sintering die 80 and a lower punch 90 serve as the container. Although the buffer member 70 may not be disposed, it is preferable to use the buffer member 70. Accordingly, even when the conversion member 2 made of a sintered body is used, the pressure applied to the conversion member 2 at the time of subsequently sintering the holding member 3 can be substantially uniform (see FIG. 18C). Therefore, breakage or the like of the conversion member 2 made of a sintered body can be reduced.

Next, a release sheet 60 is disposed above the buffer member 70 so that the sintered body 100 (see FIG. 18C) composed of the conversion member 2 and the holding member 3 is easily taken out from the container in a later step. For the release sheet 60, for example, a polyethylene sheet or a carbon sheet can be used.

In providing of the conversion member 2, a powder in which a powdered fluorescent material and a powdered sintering aid containing a material identical to the holding member 3 are mixed is sintered to form a plate-shaped sintered body in a region surrounded by the lower punch 90 and the sintering die 80 that are provided with the buffer member 70 and the release sheet 60. Further, using a machining center, a plurality of projected portions are formed in the plate-shaped sintered body to obtain the conversion member 2 composed of a sintered body including a plurality of projected portions at the upper surface side.

(1-2) Disposing Holding Member

Next, the powdered holding member 3 is disposed between a plurality of projected portions in the conversion member 2 as shown in FIG. 18B. Using the powdered holding member 3 allows for facilitating charging the holding member 3 between adjacent ones of the projected portions, so that gaps between the conversion member 2 and the holding member 3 can be substantially eliminated. In this method of manufacturing the sintered body, the conversion member 2 is disposed such that the projected portions face upward, and the powdered holding member 3 is disposed from the upper side, so that the holding member 3 is disposed between the projected portions of the conversion member 2.

In FIG. 18B, the conversion member 2 made of a sintered body is disposed at the lower side, and the powdered holding member 3 is disposed at the upper side, but order of arrangement may be reversed. That is, after the powdered holding member 3 is disposed in the container, the conversion member 2 made of a sintered body is then disposed above the holding member 3 such that the projected portions of the conversion member 2 face downward, and pressing is performed as necessary. Also in this manner, the holding member 3 can be disposed between a plurality of projected portions in the conversion member 2.

(1-3) Providing Sintered Body

Next, the powdered holding member 3 and the conversion member 2 including a plurality of projected portions is sintered to provide the sintered body 100 in which the conversion member 2 and the holding member 3 are molded integrally with each other as shown in FIG. 18C. The conversion member 2 and the holding member 3 are preferably sintered while being pressurized at 10 MPa or more and 50 MPa or less. This allows for improving bonding strength between the conversion member 2 and the holding member 3.

The sintered body 100 is preferably subjected to a heat treatment at 1000° C. or higher and 1500° C. or lower in an oxidizing atmosphere (e.g., air atmosphere) after the step of providing a sintered body. Accordingly, penetration of carbon of the sintering mold to an oxide contained in the holding member 3 or deoxidation can be reduced, so that the reflectance of the holding member 3 can be increased.

Second Method of Manufacturing a Sintered Body

The second method of manufacturing a sintered body will be described.

The second method of manufacturing a sintered body are substantially identical to the first method of manufacturing a sintered body except for manner described below, but the second manufacturing method is different from the first manufacturing method in that a powdered conversion member and a powdered holding member are sintered. Hereinafter, steps in the second method of manufacturing a sintered body will be described.

(1) Obtaining Sintered Body

As shown in FIGS. 19A to 19D, the conversion member 2 and the holding member 3 are brought into contact with each other to integrally form the sintered body 100. More specifically, the step includes: providing the holding member 3; disposing the conversion member 2; and providing the sintered body 100.

(1-1) Providing Holding Member

The holding member 3 with a plurality of recesses provided on an upper surface thereof is provided. In the second method of manufacturing a sintered body, the step of providing the holding member 3 includes: charging the powdered holding member 3 in a container (the lower punch 90 and sintering die 80) as a sintering mold (see FIG. 19A); and forming the holding member 3 including a plurality of projected portions or recesses by pressing the powdered holding member 3 with a pressing member 92 having a plurality of projected portions or recesses (see FIG. 19B). In this manner, the holding member 3 that is powdered and maintains to have a certain shape (shape with a plurality of recesses) can be formed by a relatively simple method. In the step of providing the holding member 3, the holding member 3 made of a sintered body may be provided.

(1-2) Disposing Conversion Member

The powdered conversion member 2 containing a fluorescent material is provided. The powdered conversion member 2 is disposed in a plurality of recesses in the holding member 3 (see FIG. 19C). That is, in the second method of manufacturing a sintered body, the powdered conversion member 2 is disposed on the powdered holding member 3. When the holding member 3 made of a sintered body is provided, the holding member 3 and the conversion member 2 are arranged in any appropriate order. That is, the holding member 3 composed of a sintered body may be disposed at the lower side, with the powdered conversion member 2 disposed on the upper side. Alternatively, the order of arranging the holding member 3 and the conversion member 2 may be reversed.

(1-3) Obtaining Sintered Body

Figure 19A:
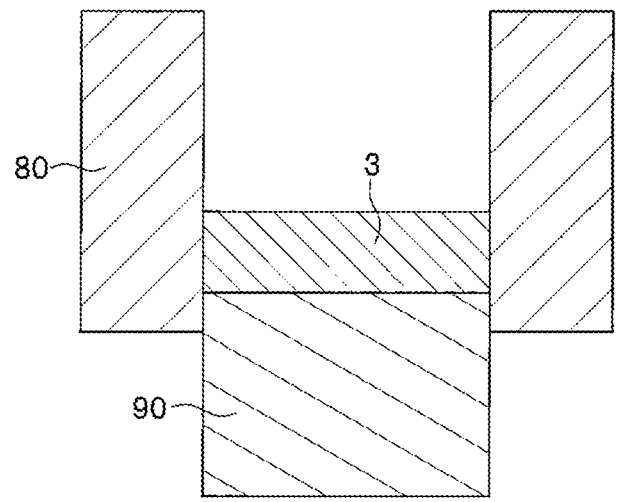
FIG. 19A is a schematic diagram for illustrating a second method of manufacturing a sintered body.
Figure 19B:
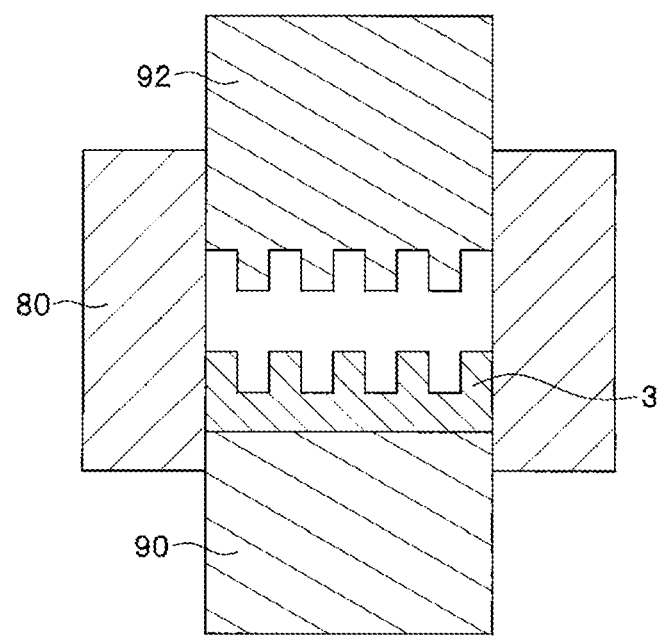
FIG. 19B is a schematic diagram for illustrating the second method of manufacturing a sintered body.
Figure 19C:
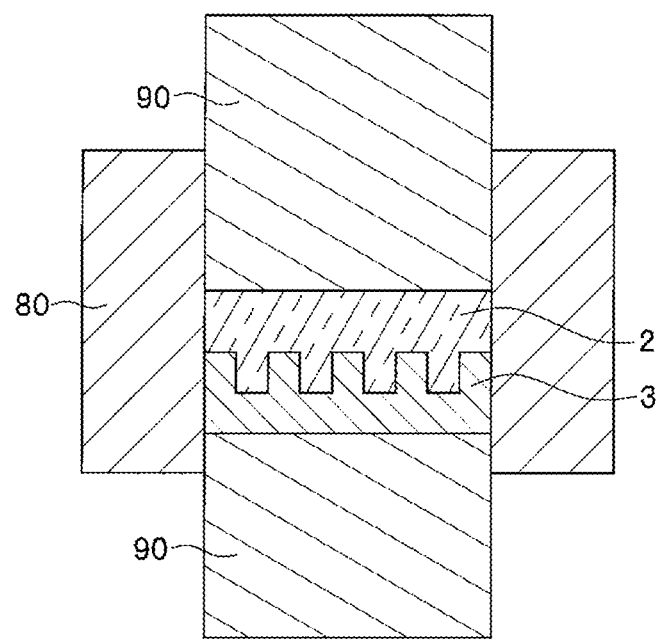
FIG. 19C is a schematic diagram for illustrating the second method of manufacturing a sintered body.
Figure 19D:
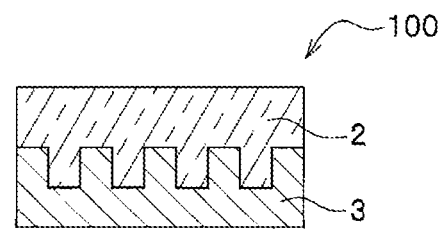
FIG. 19D is a schematic diagram for illustrating the second method of manufacturing a sintered body.

Next, both the powdered conversion member 2 and the powdered holding member 3 are sintered to obtain the sintered body 100 in which the conversion member 2 and the holding member 3 are integrally molded, as shown in FIG. 19D. In the second method of manufacturing a sintered body, both the powdered conversion member 2 and the powdered holding member 3 are sintered to provide the sintered body 100 in one step. At this time, it is necessary to increase the transmittance of a sintering aid contained in the conversion member 2, and therefore the sintering temperature is preferably higher than that in the first method of manufacturing a sintered body.

Third Method of Manufacturing a Sintered Body

The third method of manufacturing a sintered body will be described.

The third method of manufacturing a sintered body is substantially identical to the second manufacturing method except for the steps that will be described below, and the third method of manufacturing a sintered body is different from the second method of manufacturing a sintered body in that a portion of the sintered body at the upper surface side thereof is composed only of the conversion member, and a portion of the sintered body at the lower surface side thereof is composed of the conversion member and the holding member. Hereinafter, steps of the third method will be described.

(1) Obtaining Sintered Body

As shown in FIGS. 20A to 20D, in the step of obtaining a sintered body, the conversion member 2 and the holding member 3 are brought into contact with each other to be integrally molded, which allows for obtaining the sintered body 100. More specifically, the step of obtaining the sintered body includes: providing the holding member 3; disposing the conversion member 2; and obtaining the sintered body 100.

(1-1) Providing Holding Member

Figure 20A:
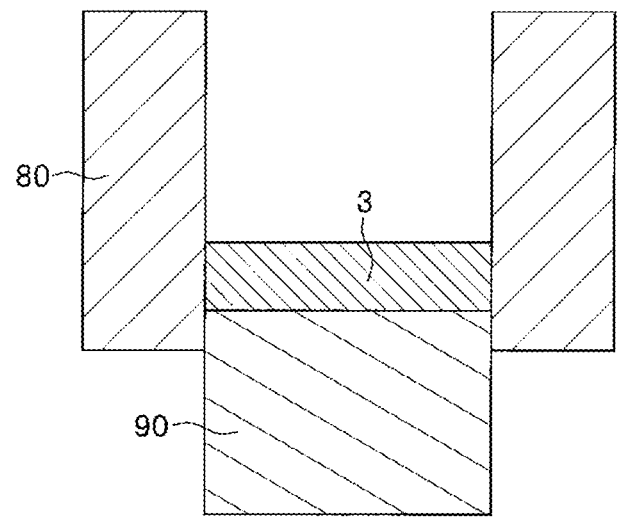
FIG. 20A is a schematic diagram for illustrating a third method of manufacturing a sintered body.
Figure 20B:
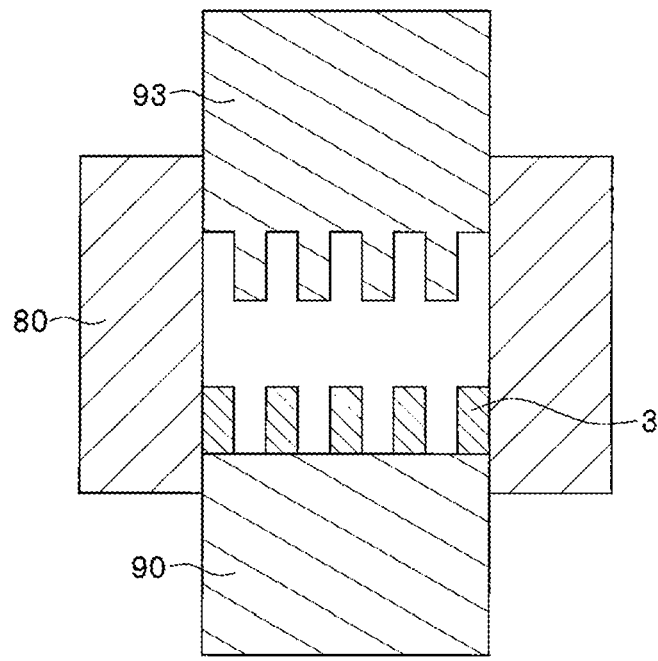
FIG. 20B is a schematic diagram for illustrating the third method of manufacturing a sintered body.
Figure 20C:
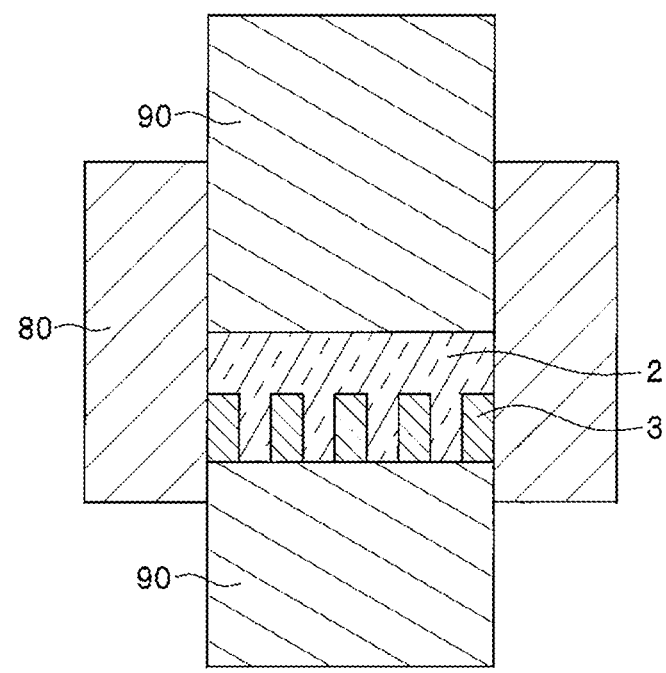
FIG. 20C is a schematic diagram for illustrating the third method of manufacturing a sintered body.

The holding member 3 defining a plurality of through-holes extending through the placed holding member 3 in a thickness direction and being in a powder form that maintains to be a certain shape is provided (see FIGS. 20A and 20B). In this step, the holding member 3 made of a sintered body may be provided.

(1-2) Disposing Conversion Member

The powdered conversion member 2 containing a fluorescent material is provided. The powdered conversion member 2 is disposed to fill a plurality of through-holes in the holding member 3 (see FIG. 20C).

(1-3) Obtaining Sintered Body

Figure 20D:
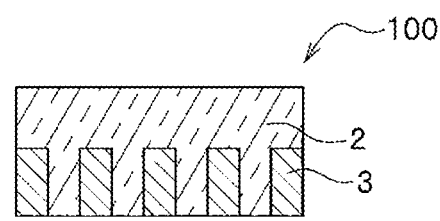
FIG. 20D is a schematic diagram for illustrating the third method of manufacturing a sintered body.

Next, both the powdered conversion member 2 and the powdered holding member 3 are sintered to obtain the sintered body 100 in which the conversion member 2 and the holding member 3 are molded integrally with each other, as shown in FIG. 20D.

Other Examples of Method of Manufacturing Optical Member

In the above-described method of manufacturing an optical member, a sintered body in which a conversion member and a holding member are molded integrally with each other is used, but a fixed body may be used in which the conversion member and the holding member are firmly bonded to each other via glass or the like disposed therebetween to be integrally molded. Hereinafter, other examples of the method of manufacturing an optical member using the fixed body will be described.

Figure 21A:
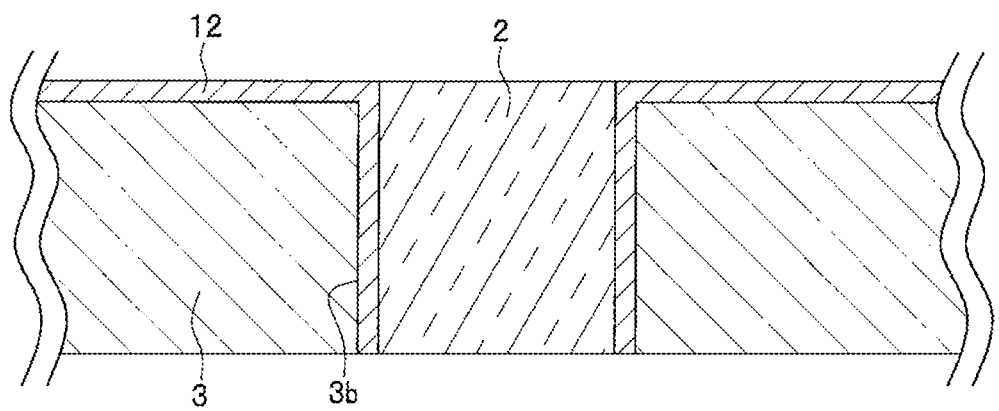
FIG. 21A is a schematic diagram for illustrating another method of manufacturing an optical member.
Figure 21B:
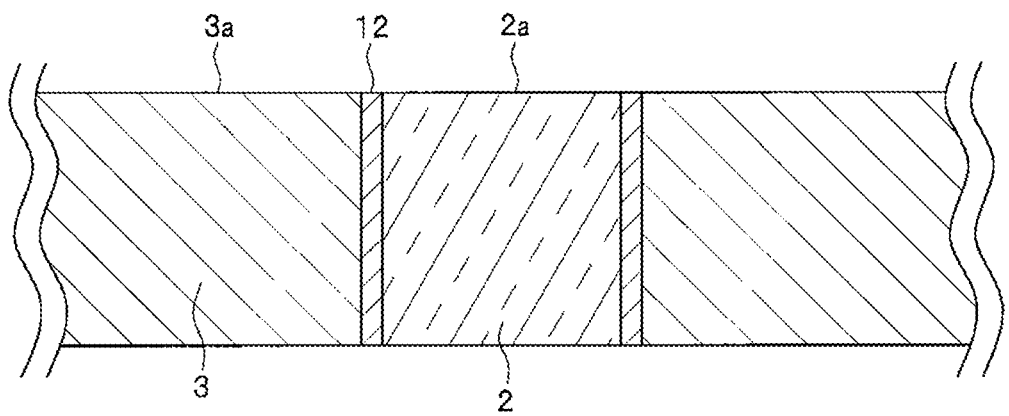
FIG. 21B is a schematic diagram for illustrating another method of manufacturing an optical member.

As shown in FIGS. 21A and 21B, one of such examples of the method of manufacturing an optical member includes: (1) obtaining a fixed body; (2) removing a portion of a glass film; and (3) forming a wiring. Hereinafter, steps will be described.

(1) Obtaining Fixed Body

As shown in FIG. 21A, a fixed body in which the conversion member 2 and the holding member 3 are integrally molded is obtained. More specifically, this step includes: forming a glass film 12; and fixing the conversion member 2.

(1-1) Forming Glass Film

The glass film 12 is formed on an inner wall surface of a through-hole 3b defined in the holding member 3, or on the inner wall surface and a surface of the holding member 3 on the upper surface side. For forming the through-hole 3b in the holding member 3, a perforation processing method that is conventionally known can be used. The through-hole 3b can have any appropriate size according to the size of the conversion member 2. The glass film 12 is formed by sputtering or the like. The thickness of the glass film 12 may be in a range of 0.1 μm to 20 μm.

With the thickness of the glass film 12 less than 0.1 μm, the inner wall surface of the through-hole 3b tends to have a portion where the glass film 12 is not formed, so that the holding strength of the conversion member 2 is easily reduced in the manufactured optical member. With the thickness of the glass film 12 more than 20 μm, absorption of light by the glass film 12 may be increased, so that light emission efficiency in the optical member tends to be deteriorated.

For a material of the glass film 12, light-transmissive glass such as borosilicate glass, soda quartz glass, soda glass or lead glass is preferably used. The glass film 12 preferably has a softening point lower than that of each of the conversion member 2 and the holding member 3 in order to perform thermal fuse-bonding in the next step.

(1-2) Fixing Conversion Member

The conversion member 2 is fixed to the holding member 3 via the glass film 12 disposed therebetween. The conversion member 2 is disposed in the through-hole 3b with the glass film 12 disposed on the inner wall surface defining the through-hole, and the glass film 12 is heated at a first atmospheric temperature to provide a fixed body in which the conversion member 2 is fixed to the holding member 3 with the glass film 12 disposed therebetween.

At this time, to allow the glass film 12 to be deformed and thermally fuse-bonded, the first atmospheric temperature is appropriately selected according to the softening point of the glass film 12 formed on the inner wall surface of the through-hole 3b. The glass film 12 formed on the inner wall surface is solid at a room temperature, and is softened by heating, and hardened when returned to room temperature. Accordingly, the conversion member 2 disposed in the through-hole 3b can be fixed to the holding member 3 without breakage.

(2) Removing a Portion of Glass Film

A portion of the fixed body at an upper surface side thereof is removed by grinding, polishing, CMP or the like, as shown in FIG. 21B. In this step, it is preferable that the glass film 12 is removed until a surface of the holding member 3 at the upper surface side thereof is exposed. Accordingly, a first surface, which is to be a light-irradiated surface or light extraction surface, of the conversion member 2, and a second surface, which is in the same plane as the first surface of the holding member 3, are obtained. With the conversion member 2 fixed to the holding member 3 without a gap, it is possible to obtain a surface on which the wiring 4 can be formed. This step may be omitted. In this manufacturing method, (3) forming wiring is the same as that in each of the first to third embodiments.

The light extraction surface of the conversion member 2 may be covered using glass which can be softened like the glass film 12. Steps other than those described above, the same steps or the like as in the first to third embodiments can be employed.

What is claimed is:

1. An optical member comprising:
   a conversion member having a first surface, and a second surface opposite the first surface, the conversion member comprising a fluorescent material;
   a light reflecting ceramic holding the conversion member, the light reflecting ceramic having a first surface, and a second surface opposite the first surface, wherein the first surface of the light reflecting ceramic is continuous with the first surface of the conversion member;
   a light-transmissive film continuously disposed on the first surface of the conversion member and the first surface of the light reflecting ceramic; and
   a wiring on the light-transmissive film.

2. The optical member according to claim 1, wherein the light-transmissive film comprises silicon oxide.

3. The optical member according to claim 1, wherein the light-transmissive film is a $SiO_2$ film.

4. The optical member according to claim 1, wherein a thickness of the light-transmissive film is in a range of 1 μm to 15 μm.

5. The optical member according to claim 1, wherein the conversion member comprises a ceramic containing the fluorescent material.

6. The optical member according to claim 1, wherein the wiring comprises a light-transmissive electrically conductive material.

7. The optical member according to claim 1, wherein the wiring comprises indium tin oxide.

8. The optical member according to claim 1, wherein a thickness of the wiring is in a range of 50 nm to 200 nm.

9. The optical member according to claim 1, wherein a width of the wiring is in a range of 5 μm to 50 μm.

10. The optical member according to claim 1, wherein the light reflecting ceramic includes a through hole that extends from the first surface of the light reflecting ceramic to the second surface of the light reflecting ceramic, and the conversion member is located in the through hole.

11. A light emitting device comprising:
    a conversion member having a first surface, and a second surface opposite the first surface, the conversion member comprising a fluorescent material;
    a light reflecting ceramic holding the conversion member, the light reflecting ceramic having a first surface, and a second surface opposite the first surface, wherein the first surface of the light reflecting ceramic is continuous with the first surface of the conversion member;
    a light-transmissive film continuously disposed on the first surface of the conversion member and the first surface of the light reflecting ceramic;
    a wiring on the light-transmissive film; and
    a laser element disposed so as to irradiate the conversion member with a laser light.

12. The light emitting device according to claim 11, further comprising:
    a package surrounding the laser element,
    wherein the light reflecting ceramic is fixed to the package.

13. The light emitting device according to claim 12, wherein the package includes a housing main body portion and a cover bonded to the housing main body portion.

14. The light emitting device according to claim 11, further comprising a detection circuit configured to detect a deviation in a resistance value of the wiring.

15. The light emitting device according to claim 13, wherein the cover includes sapphire.

16. The light emitting device according to claim 11, wherein the light reflecting ceramic includes a through hole that extends from the first surface of the light reflecting ceramic to the second surface of the light reflecting ceramic, and the conversion member is located in the through hole.

* * * * *